(12) United States Patent
Cheng et al.

(10) Patent No.: US 9,831,846 B2
(45) Date of Patent: Nov. 28, 2017

(54) POWER CONVERSION SYSTEM

(71) Applicant: Rockwell Automation Technologies, Inc., Mayfield Heights, OH (US)

(72) Inventors: Zhongyuan Cheng, Cambridge (CA); Navid R. Zargari, Kitchener (CA)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 15/132,477

(22) Filed: Apr. 19, 2016

(65) Prior Publication Data
US 2017/0302244 A1    Oct. 19, 2017

(51) Int. Cl.
*H02M 7/48* (2007.01)
*H03H 7/20* (2006.01)
*H02M 1/12* (2006.01)
*H02M 1/14* (2006.01)

(52) U.S. Cl.
CPC ............. *H03H 7/20* (2013.01); *H02M 1/12* (2013.01); *H02M 1/14* (2013.01)

(58) Field of Classification Search
CPC ........ H02M 7/10; H02M 7/49; H02M 7/5395; H02M 7/493; H02M 7/487; H02J 3/36; H01F 30/02
USPC ..... 363/65, 71, 98, 132, 148, 149, 152, 154, 363/125; 318/801, 803, 811
See application file for complete search history.

(56) References Cited

U.S. PATENT DOCUMENTS

| | | | | |
|---|---|---|---|---|
| 5,625,545 A * | 4/1997 | Hammond | ............ | H02M 3/285 363/65 |
| 5,886,888 A * | 3/1999 | Akamatsu | ................ | H02J 3/01 363/65 |
| 6,229,722 B1 * | 5/2001 | Ichikawa | ................ | H02M 7/10 363/71 |
| 6,301,130 B1 * | 10/2001 | Aiello | .................... | H02M 7/49 363/37 |
| 6,426,602 B1 * | 7/2002 | McCann | ................ | B62D 5/046 318/284 |
| 7,375,996 B2 * | 5/2008 | Singh | ..................... | H01F 30/02 363/149 |
| 7,428,158 B2 * | 9/2008 | Bousfield | ................ | H02M 1/12 363/39 |
| 8,488,354 B2 * | 7/2013 | Swamy | .................. | H02M 7/08 363/126 |

(Continued)

FOREIGN PATENT DOCUMENTS

| | | | |
|---|---|---|---|
| EP | 2587658 | A2 | 5/2013 |
| EP | 2790313 | A2 | 10/2014 |

OTHER PUBLICATIONS

European Patent Office, Extended European Search Report, Aug. 28, 2017, 10 pages.

*Primary Examiner* — Rajnikant Patel
(74) *Attorney, Agent, or Firm* — Kunzler Law Group

(57) ABSTRACT

For power conversion, a power conversion system includes a plurality of power converters and a phase shifting transformer. The phase shifting transformer includes 3-phase primary windings, a core and a plurality of m secondary winding groups. Each of the secondary winding groups includes n secondary windings in electromagnetic communication with a corresponding primary winding and feeding the plurality of power converters. Phase angle sets of the secondary winding groups are all different with a non-zero secondary winding phase shift between any two secondary winding groups.

20 Claims, 15 Drawing Sheets

(56) References Cited

U.S. PATENT DOCUMENTS

| | | | |
|---|---|---|---|
| 9,236,755 B2* | 1/2016 | Chang | B60L 11/1812 |
| 9,337,746 B2* | 5/2016 | Yoo | H02M 7/483 |
| 2011/0187484 A1 | 8/2011 | Owen | |

* cited by examiner

| Secondary Winding 114 | 1 | 2 | 3 | ... | n |
|---|---|---|---|---|---|
| Virtual Group 117a | $\alpha_0+30°-0.5\delta$ | $\alpha_0+30°-1.5\delta$ | $\alpha_0+30°-2.5\delta$ | ... | $\alpha_0+30°-(n-0.5)\delta$ |
| Virtual Group 117b | $\alpha_0+30°-0.5\delta+\gamma$ | $\alpha_0+30°-1.5\delta+\gamma$ | $\alpha_0+30°-2.5\delta+\gamma$ | ... | $\alpha_0+30°-(n-0.5)\delta+\gamma$ |

FIG. 3

| Secondary Winding 114 | 1 | 2 | 3 | 4 | 5 | 6 | ... | n-2 | n-1 | n |
|---|---|---|---|---|---|---|---|---|---|---|
| Virtual Group 117a | A | B | C | A | B | C | ... | A | B | C |
| Virtual Group 117b | B | C | A | B | C | A | ... | B | C | A |

FIG. 4

| Secondary Winding 114 | A1 | A2 | A3 | A4 |
|---|---|---|---|---|
| Group A | 22.5° | 7.5° | -7.5° | -22.5° |
| Secondary Winding 114 | B1 | B2 | B3 | B4 |
| Group B | 22.5° | 7.5° | -7.5° | -22.5° |
| Secondary Winding 114 | C1 | C2 | C3 | C4 |
| Group C | 22.5° | 7.5° | -7.5° | -22.5° |

Prior Art

FIG. 5A

| Secondary Winding 114 | A1 | A2 | A3 | A4 |
|---|---|---|---|---|
| Group A | 25° | 10° | -5° | -20° |
| Secondary Winding 114 | B1 | B2 | B3 | B4 |
| Group B | 30° | 15° | 0° | -15° |
| Secondary Winding 114 | C1 | C2 | C3 | C4 |
| Group C | 20° | 5° | -10° | -25° |

| Row # | S.W \ h | 1 | 5&7 | 11&13 | 17&19 | 23&25 | 29&31 | 35&37 | 41&43 | 47&49 | 53&55 | 59&61 | 65&67 | 71&73 |
|---|---|---|---|---|---|---|---|---|---|---|---|---|---|---|
| 1 | A1 22.5° | 0° | 135° | 270° | 45° | 180° | 315° | 90° | 225° | 0° | 135° | 270° | 45° | 180° |
| 2 | A2 7.5° | 0° | 45° | 90° | 135° | 180° | 225° | 270° | 315° | 0° | 45° | 90° | 135° | 180° |
| 3 | A3 -7.5° | 0° | 315° | 270° | 225° | 180° | 135° | 90° | 45° | 0° | 315° | 270° | 225° | 180° |
| 4 | A4 -22.5° | 0° | 225° | 90° | 315° | 180° | 45° | 270° | 135° | 0° | 225° | 90° | 315° | 180° |
| 5 | B1 22.5° | 0° | 135° | 270° | 45° | 180° | 315° | 90° | 225° | 0° | 135° | 270° | 45° | 180° |
| 6 | B2 7.5° | 0° | 45° | 90° | 135° | 180° | 225° | 270° | 315° | 0° | 45° | 90° | 135° | 180° |
| 7 | B3 -7.5° | 0° | 315° | 270° | 225° | 180° | 135° | 90° | 45° | 0° | 315° | 270° | 225° | 180° |
| 8 | B4 -22.5° | 0° | 225° | 90° | 315° | 180° | 45° | 270° | 135° | 0° | 225° | 90° | 315° | 180° |
| 9 | C1 22.5° | 0° | 135° | 270° | 45° | 180° | 315° | 90° | 225° | 0° | 135° | 270° | 45° | 180° |
| 10 | C2 7.5° | 0° | 45° | 90° | 135° | 180° | 225° | 270° | 315° | 0° | 45° | 90° | 135° | 180° |
| 11 | C3 -7.5° | 0° | 315° | 270° | 225° | 180° | 135° | 90° | 45° | 0° | 315° | 270° | 225° | 180° |
| 12 | C4 -22.5° | 0° | 225° | 90° | 315° | 180° | 45° | 270° | 135° | 0° | 225° | 90° | 315° | 180° |
| 13 | Spectrum A | 4 | 0 | 0 | 0 | 4 | 0 | 0 | 0 | 4 | 0 | 0 | 0 | 4 |
| 14 | Spectrum B | 4 | 0 | 0 | 0 | 4 | 0 | 0 | 0 | 4 | 0 | 0 | 0 | 4 |
| 15 | Spectrum C | 4 | 0 | 0 | 0 | 4 | 0 | 0 | 0 | 4 | 0 | 0 | 0 | 4 |
| 16 | Primary | 12 | 0 | 0 | 0 | 12 | 0 | 0 | 0 | 12 | 0 | 0 | 0 | 12 |

| Row # | S.W     h | 1  | 5&7   | 11&13 | 17&19 | 23&25 | 29&31 | 35&37 | 41&43 | 47&49 | 53&55 | 59&61 | 65&67 | 71&73 |
|---|---|---|---|---|---|---|---|---|---|---|---|---|---|---|
| 1  | A1 25°      | 0° | 150° | 300° | 90°  | 240° | 30°  | 180° | 330° | 120° | 270° | 60°  | 210° | 0° |
| 2  | A2 10°      | 0° | 60°  | 120° | 180° | 240° | 300° | 0°   | 60°  | 120° | 180° | 240° | 300° | 0° |
| 3  | A3 -5°      | 0° | 330° | 300° | 270° | 240° | 210° | 180° | 150° | 120° | 90°  | 60°  | 30°  | 0° |
| 4  | A4 -20°     | 0° | 240° | 120° | 0°   | 240° | 120° | 0°   | 240° | 120° | 0°   | 240° | 120° | 0° |
| 5  | B1 30°      | 0° | 180° | 0°   | 180° | 0°   | 180° | 0°   | 180° | 0°   | 180° | 0°   | 180° | 0° |
| 6  | B2 15°      | 0° | 90°  | 180° | 270° | 0°   | 90°  | 180° | 270° | 0°   | 90°  | 180° | 270° | 0° |
| 7  | B3 0°       | 0° | 0°   | 0°   | 0°   | 0°   | 0°   | 0°   | 0°   | 0°   | 0°   | 0°   | 0°   | 0° |
| 8  | B4 -15°     | 0° | 270° | 180° | 90°  | 0°   | 270° | 180° | 90°  | 0°   | 270° | 180° | 90°  | 0° |
| 9  | C1 20°      | 0° | 120° | 240° | 0°   | 120° | 240° | 0°   | 120° | 240° | 0°   | 120° | 240° | 0° |
| 10 | C2 5°       | 0° | 30°  | 60°  | 90°  | 120° | 150° | 180° | 210° | 240° | 270° | 300° | 330° | 0° |
| 11 | C3 -10°     | 0° | 300° | 240° | 180° | 120° | 60°  | 0°   | 300° | 240° | 180° | 120° | 60°  | 0° |
| 12 | C4 -25°     | 0° | 210° | 60°  | 270° | 120° | 330° | 180° | 30°  | 240° | 90°  | 300° | 150° | 0° |
| 13 | Spectrum A  | 4  | 0    | 0    | 0    | 4    | 0    | 0    | 0    | 4    | 0    | 0    | 0    | 4  |
| 14 | Spectrum B  | 4  | 0    | 0    | 0    | 4    | 0    | 0    | 0    | 4    | 0    | 0    | 0    | 4  |
| 15 | Spectrum C  | 4  | 0    | 0    | 0    | 4    | 0    | 0    | 0    | 4    | 0    | 0    | 0    | 4  |
| 16 | Primary     | 12 | 0    | 0    | 0    | 0    | 0    | 0    | 0    | 0    | 0    | 0    | 0    | 12 |

FIG. 5D

POWER CONVERSION SYSTEM

BACKGROUND INFORMATION

The subject matter disclosed herein relates to power conversion systems.

BRIEF DESCRIPTION

A power conversion system is disclosed. The power conversion system includes a plurality of power converters and a phase shifting transformer. The phase shifting transformer includes 3-phase primary windings, a core, and a plurality of m secondary winding groups. Each of the secondary winding groups includes n secondary windings in electromagnetic communication with a corresponding primary winding and feeding the plurality of power converters. Within each of the m secondary winding groups, a phase angle set of the secondary windings is selected that shifts the secondary winding phases from each adjacent secondary winding phase by a secondary winding phase shift $\delta$, where $\delta=60°/n$, to form 6×n pulse harmonics cancellation pattern in a primary line current. Phase angle sets of the secondary winding groups are all different with a non-zero secondary winding phase shift between any two secondary winding groups. A group phase shift between the plurality of secondary winding groups equals $k\delta/m$, where k is any integer that is not a multiple of m. A harmonic cancellation pattern in a transformer primary-side input is of 6×m×n pulse.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which:

FIG. 3 is a table of secondary winding phases for virtual secondary winding groups according to an embodiment;

FIG. 4 is a table of virtual secondary winding group organization according to an embodiment;

FIG. 5A is a table of a secondary winding organization according to the prior art;

FIG. 5B is a table of a secondary winding organization according to an embodiment;

FIG. 5C is a table of the secondary-winding harmonic currents referred to the primary winding according to the prior art;

FIG. 5D is a table of a secondary-winding harmonic currents referred to the primary winding according to an embodiment;

DETAILED DESCRIPTION

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

The schematic flowchart diagrams and/or schematic block diagrams in the Figures illustrate the architecture, functionality, and operation of possible implementations. It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Although various arrow types and line types may be employed in the flowchart and/or block diagrams, they are understood not to limit the scope of the corresponding embodiments. Indeed, some arrows or other connectors may be used to indicate only an exemplary logical flow of the depicted embodiment.

The description of elements in each Figure may refer to elements of proceeding Figures. Like numbers refer to like elements in all Figures, including alternate embodiments of like elements.

Medium Voltage (MV) drives are often used to provide variable torque for a wide range of applications. The MV drives may create multiple Direct Current (DC) sources for a drive topology from Alternating Current (AC) power. The MV drives may include phase shift transformers that employ large numbers of secondary windings organized as multi-pulse converters to cancel specific harmonics in the line current. Unfortunately, the phase shift transformers cannot cancel all harmonic currents produced by the converters and may still introduce some harmonics into the line current.

The embodiments described herein create the DC sources needed by the drive topology with an improved harmonic spectrum in the line current by selecting phase angle sets for the secondary windings that reduce the harmonics. As a result, a power conversion system may supply the DC sources with reduced harmonics and at increased power converter pulse numbers.

Figure 1A:
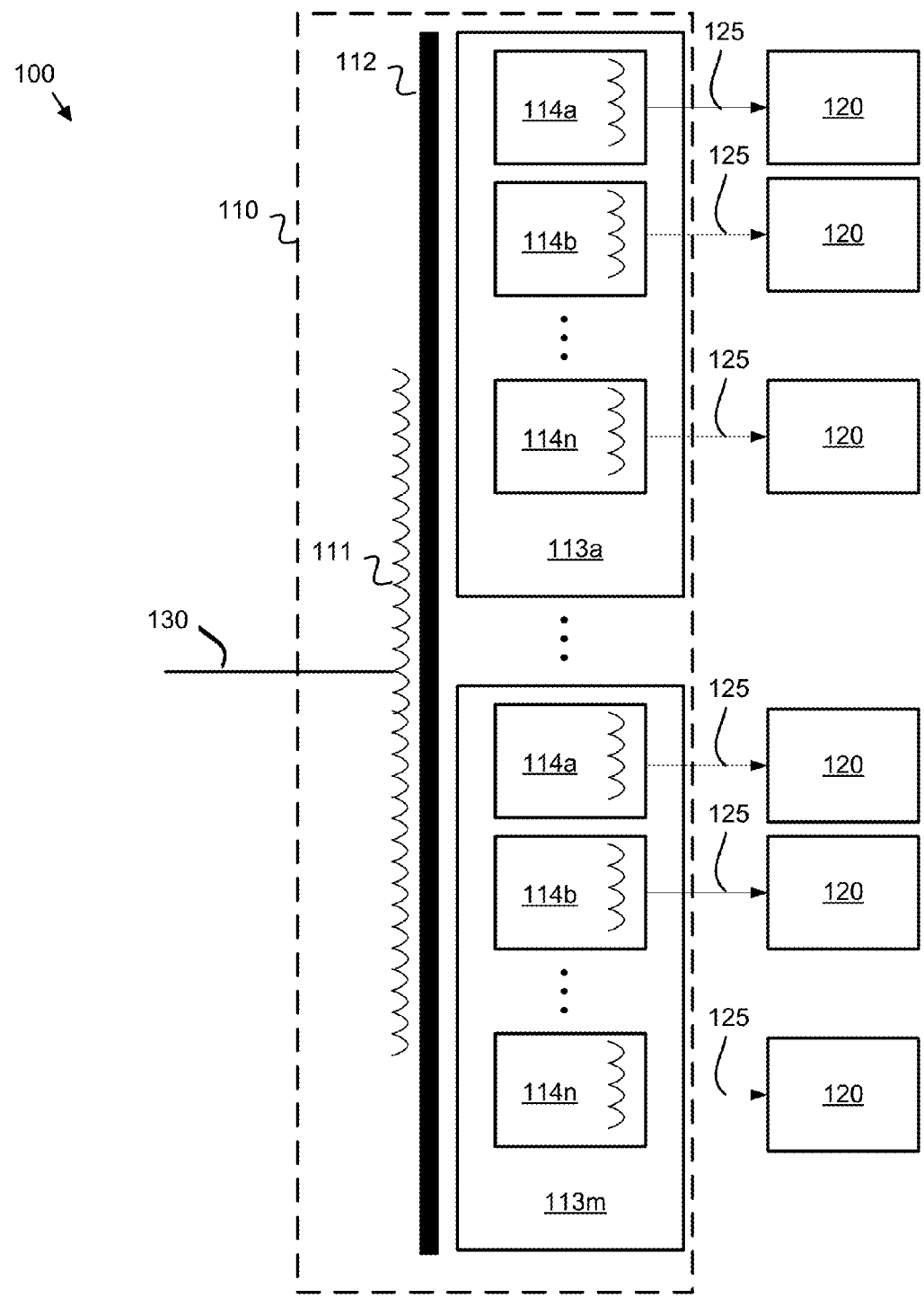
FIG. 1A is a schematic block diagram of power conversion system according to an embodiment.

FIG. 1A is a schematic block diagram of a power conversion system 100 according to one embodiment. The power conversion system 100 may include a phase shifting transformer 110 and a plurality of power converters 120. The phase shifting transformer 110 may include a three-phase power input 130, 3-phase primary windings 111, a core 112, and a plurality of m secondary winding groups 113. Each of the secondary winding groups 113 may include n secondary windings 114 in electromagnetic communication with a corresponding primary winding 111 and feeding the plurality of power converters 120 with a power converter input 125. A transformer primary-side input may be the primary windings 111 and/or the power input 130.

Each power converter 120 may be selected from the group consisting of a cascaded H bridge power converter 120 and a cascaded neutral point clamp power converter 120. The power converters 120 are described in more detail in FIGS. 2A and 2B.

Figure 1B:
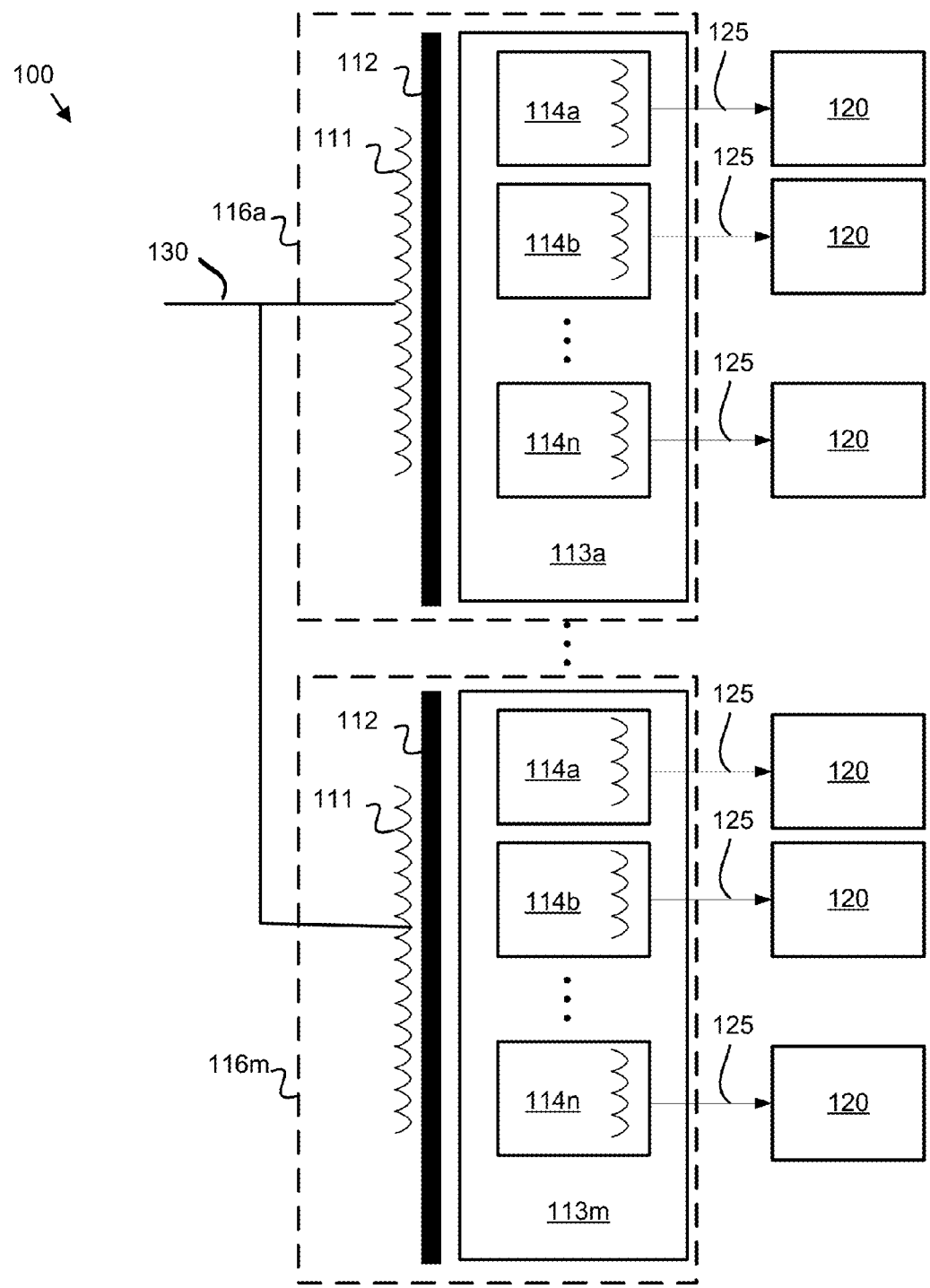
FIG. 1B is a schematic block diagram of a power conversion system according to an alternative embodiment.

FIG. 1B is a schematic block diagram of a power conversion system 100 according to an alternate embodiment. In the depicted embodiment, the power conversion system 100 includes a plurality of m phase shifting transformers 116. Each of the phase shifting transformers may include a primary winding 111, a core 112, and at least one secondary winding group 113.

Each of the secondary winding groups 113 may include a plurality of n secondary windings 114 in electromagnetic communication with the corresponding primary winding 111 and feeding the plurality of power converters 120 with the power converter input 125.

Figure 1C:
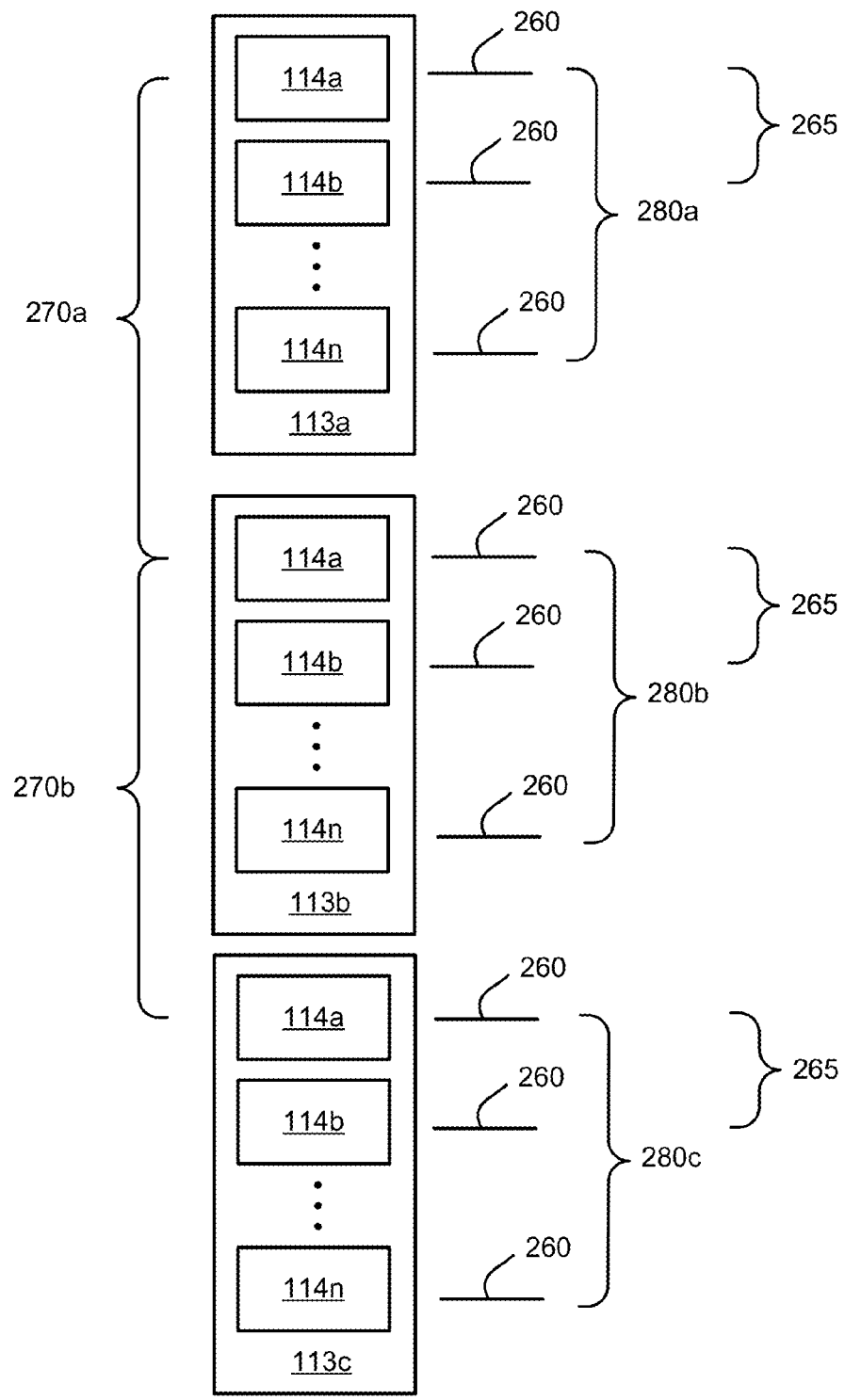
FIG. 1C is a schematic block diagram of secondary winding groups according to an embodiment.

FIG. 1C is a schematic block diagram of secondary winding groups 113. In the depicted embodiment, three secondary winding groups 113 are shown, although any number of secondary winding groups 113 may be employed. There is a group phase shift (GPS) 270 between secondary winding phases 260 of the corresponding secondary windings 114 in each of the secondary winding groups 113. In one embodiment, the GPS 270 is calculated using Equation 1, where k is any integer that is not a multiple of the number (m) of secondary winding groups 113, and δ is a secondary winding phase shift 265 within a secondary winding group 113.

$$GPS = k\delta/m \qquad \text{Equation 1}$$

The phase angle set δ 280a-c of secondary winding phase shifts 265 of secondary winding phases 260 for the secondary windings 114 within a secondary winding group 113 may be calculated using Equation 2, where n is the number of secondary windings 114 in a secondary winding group 113.

$$\delta = 60°/n \qquad \text{Equation 2}$$

The phase angle sets 280a-c may form a 6×n pulse harmonics cancellation pattern in the primary-side line current for the converters 120 fed by each group of secondary windings 113. Traditionally the GPS 270 is zero, thus the overall harmonic cancellation pattern in the primary-winding current for all the power converters 120 has been limited to 6×n pulse. However, in the embodiments, the overall pulse number of harmonic cancellation pattern in the primary-side current will be increased by introducing the non-zero GPS 270 as will be described hereafter.

In one embodiment, for the power conversion system 100 of FIG. 1A, the number m of secondary winding groups 113 is 3. The GPS 270 between different secondary winding groups 113 may be one of ±δ/3 or ±2δ/3. The GPS 270 may comprise a combination selected from the group of angles consisting of +δ/3 and −δ/3, +δ/3 and 2δ/3, and −δ/3 and −2δ/3.

In one embodiment, the number n of secondary windings 114 in each secondary winding group 113 is 1. The phase angle sets 280 of the three secondary winding groups 113 may be ($\alpha_0 - 20°$), ($\alpha_0 + 0°$) and ($\alpha_0 + 20°$), wherein $\alpha_0$ is an arbitrary offset angle. Table 1 illustrates one embodiment of the phase angle set 280 for n=1.

TABLE 1

| | Secondary Winding 1 |
|---|---|
| Group A | $\alpha_0 - 20°$ |
| Group B | $\alpha_0 + 0°$ |
| Group C | $\alpha_0 + 20°$ |

In addition, the harmonic cancellation pattern at the transformer primary-side input may be of 18-pulse. The harmonic cancellation pattern within each secondary winding group 113 may be of 6-pulse.

In one embodiment, the number n of secondary windings 114 in each secondary winding group 113 is 2. The phase angle sets 280 of the three secondary winding groups 113 may be ($\alpha_0 - 25°$, $\alpha_0 + 5°$), ($\alpha_0 - 15°$, $\alpha_0 + 15°$) and ($\alpha_0 - 5°$, $\alpha_0 + 25°$). Table 2 illustrates one embodiment of the phase angle set 280 for n=2.

The order of the groups and the order of the secondary winding sequence within a secondary winding group 113 can be arbitrary. For example, in Table 2, Group A, B or C can take any angle sets in the three rows as long as each group has a unique phase angle set 280, and winding 1 or 2 in Group A can take any one of the angles of the phase angle set 280 assigned to Group A as long as each secondary winding 114 has a unique phase angle 260.

TABLE 2

| | Secondary Winding | |
|---|---|---|
| | 1 | 2 |
| Group A | $\alpha_0 - 25°$ | $\alpha_0 + 5°$ |
| Group B | $\alpha_0 - 15°$ | $\alpha_0 + 15°$ |
| Group C | $\alpha_0 - 5°$ | $\alpha_0 + 25°$ |

The harmonic cancellation pattern at the transformer primary-side input may be of 36-pulse. The harmonic cancellation pattern within each secondary winding group 113 may be of 12-pulse.

In one embodiment, the number n of secondary windings 114 in each secondary winding group 113 is 3. The phase angle sets 280 of the three secondary winding groups 113 may be ($\alpha_0-26.67°$, $\alpha_0-6.67°$, $\alpha_0+13.33°$), ($\alpha_0-20°$, $\alpha_0+0°$, $\alpha_0+20°$) and ($\alpha_0-13.33°$, $\alpha_0+6.67°$, $\alpha_0+26.67°$). Table 3 illustrates one embodiment of the phase angle set 280 for n=3.

TABLE 3

| | Secondary Winding | | |
|---|---|---|---|
| | 1 | 2 | 3 |
| Group A | $\alpha_0 - 26.67°$ | $\alpha_0 - 6.67°$ | $\alpha_0 + 13.33°$ |
| Group B | $\alpha_0 - 20°$ | $\alpha_0 + 0°$ | $\alpha_0 + 20°$ |
| Group C | $\alpha_0 - 13.33°$ | $\alpha_0 + 6.67°$ | $\alpha_0 + 26.67°$ |

The harmonic cancellation pattern at the transformer primary-side input may be of 54-pulse. The harmonic cancellation pattern within each secondary winding group 113 may be of 18-pulse.

In a certain embodiment, the number n of secondary windings 114 in each secondary winding group 113 is 4. The phase angle sets 280 of the three secondary winding groups 113 may be ($\alpha_0-25°$, $\alpha_0-10°$, $\alpha_0+5°$, $\alpha_0+20°$), ($\alpha_0-20°$, $\alpha_0-5°$, $\alpha_0+10°$, $\alpha_0+25°$) and ($\alpha_0-15°$, $\alpha_0$, $\alpha_0+15°$, $\alpha_0+30°$). Table 4 illustrates one embodiment of the phase angle set 280 for n=4.

TABLE 4

| | Secondary Winding | | | |
|---|---|---|---|---|
| | 1 | 2 | 3 | 4 |
| Group A | $\alpha_0 - 25°$ | $\alpha_0 - 10°$ | $\alpha_0 + 5°$ | $\alpha_0 + 20°$ |
| Group B | $\alpha_0 - 20°$ | $\alpha_0 - 5°$ | $\alpha_0 + 10°$ | $\alpha_0 + 25°$ |
| Group C | $\alpha_0 - 15°$ | $\alpha_0$ | $\alpha_0 + 15°$ | $\alpha_0 + 30°$ |

The harmonic cancellation pattern at the transformer primary-side input may be of 72-pulse. The harmonic cancellation pattern within each secondary winding group 113 may be of 24-pulse.

In one embodiment, the number n of secondary windings 114 in each secondary winding group 113 is 5. The phase angle sets 280 of the three secondary winding groups 113 may be ($\alpha_0-28°$, $\alpha_0-16°$, $\alpha_0-4°$, $\alpha_0+8°$, $\alpha_0+20°$), ($\alpha_0-24°$, $\alpha_0-12°$, $\alpha_0+0°$, $\alpha_0+12°$, $\alpha_0+24°$) and ($\alpha_0-20°$, $\alpha_0-8°$, $\alpha_0+4°$, $\alpha_0+16°$, $\alpha_0+28°$). Table 5 illustrates one embodiment of the phase angle set 280 for n=5.

TABLE 5

| | Secondary Winding | | | | |
|---|---|---|---|---|---|
| | 1 | 2 | 3 | 4 | 5 |
| Group A | $\alpha_0 - 28°$ | $\alpha_0 - 16°$ | $\alpha_0 - 4°$ | $\alpha_0 + 8°$ | $\alpha_0 + 20°$ |
| Group B | $\alpha_0 - 24°$ | $\alpha_0 - 12°$ | $\alpha_0 + 0°$ | $\alpha_0 + 12°$ | $\alpha_0 + 24°$ |
| Group C | $\alpha_0 - 20°$ | $\alpha_0 - 8°$ | $\alpha_0 + 4°$ | $\alpha_0 + 16°$ | $\alpha_0 + 28°$ |

The harmonic cancellation pattern at the transformer primary-side input may be of 90-pulse. The harmonic cancellation pattern within each secondary winding group 113 may be of 30-pulse.

In one embodiment, the number n of secondary windings 114 in each secondary winding group 113 is 6. The phase angle sets 280 of the three secondary winding groups 113 may be ($\alpha_0-26.67°$, $\alpha_0-16.67°$, $\alpha_0-6.67°$, $\alpha_0+3.33°$, $\alpha_0+13.33°$, $\alpha_0+23.33°$), ($\alpha_0-30°$, $\alpha_0-20°$, $\alpha_0-10°$, $\alpha_0+0°$, $\alpha_0+10°$, $\alpha_0+20°$) and ($\alpha_0-23.33°$, $\alpha_0-13.33°$, $\alpha_0-3.33°$, $\alpha_0+6.67°$, $\alpha_0+16.67°$, $\alpha_0+26.67°$). Table 6 illustrates one embodiment of the phase angle set 280 for n=6.

TABLE 6

| | Secondary Winding | | | | | |
|---|---|---|---|---|---|---|
| | 1 | 2 | 3 | 4 | 5 | 6 |
| Group A | $\alpha_0 - 26.67°$ | $\alpha_0 - 16.67°$ | $\alpha_0 - 6.67°$ | $\alpha_0 + 3.33°$ | $\alpha_0 + 13.33°$ | $\alpha_0 + 23.33°$ |
| Group B | $\alpha_0 - 30°$ | $\alpha_0 - 20°$ | $\alpha_0 - 10°$ | $\alpha_0 + 0°$ | $\alpha_0 + 10°$ | $\alpha_0 + 20°$ |
| Group C | $\alpha_0 - 23.33°$ | $\alpha_0 - 13.33°$ | $\alpha_0 - 3.33°$ | $\alpha_0 + 6.67°$ | $\alpha_0 + 16.67°$ | $\alpha_0 + 26.67°$ |

The harmonic cancellation pattern at the transformer primary-side input may be of 108-pulse. The harmonic cancellation pattern within each secondary winding group 113 may be of 36-pulse.

In a certain embodiment, the number n of secondary windings 114 in each secondary winding group 113 is 7. The phase angle sets 280 of the three secondary winding groups 113 may be ($\alpha_0-22.86°$, $\alpha_0-14.29°$, $\alpha_0-5.71°$, $\alpha_0+2.86°$, $\alpha_0+11.43°$, $\alpha_0+20°$, $\alpha_0+28.57°$), ($\alpha_0-25.71°$, $\alpha_0-17.14°$, $\alpha_0-8.57°$, $\alpha_0+0°$, $\alpha_0+8.57°$, $\alpha_0+17.14°$, $\alpha_0+25.71°$), ($\alpha_0-28.57°$, $\alpha_0-20°$, $\alpha_0-11.43°$, $\alpha_0-2.86°$, $\alpha_0+5.71°$, $\alpha_0+14.29°$, $\alpha_0+22.86°$). Table 7 illustrates one embodiment of the phase angle set 280 for n=7, where $\alpha_0$ is added to each table cell.

TABLE 7

| | Secondary Winding | | | | | | |
|---|---|---|---|---|---|---|---|
| | 1 | 2 | 3 | 4 | 5 | 6 | 7 |
| Group A | −22.86° | −14.29° | −5.71° | +2.86° | +11.43° | +20° | +28.57° |
| Group B | −25.71° | −17.14° | −8.57° | 0° | +8.57° | +17.14° | +25.71° |
| Group C | −28.57° | −20° | −11.43° | −2.86° | +5.71° | +14.29° | +22.86° |

The harmonic cancellation pattern at the transformer primary-side input may be of 126-pulse. The harmonic cancellation pattern within each secondary winding group 113 may be of 42-pulse.

In one embodiment, the number n of secondary windings 114 in each secondary winding group 113 is 8. The phase angle sets 280 of the three secondary winding groups 113 may be $(\alpha_0-27.5°, \alpha_0-20°, \alpha_0-12.5°, \alpha_0-5°, \alpha_0+2.5°, \alpha_0+10°, \alpha_0+17.5°, \alpha_0+25°)$, $(\alpha_0-30°, \alpha_0-22.5°, \alpha_0-15°, \alpha_0-7.5°, \alpha_0+0°, \alpha_0+7.5°, \alpha_0+15°, \alpha_0+22.5°)$ and $(\alpha_0-25°, \alpha_0-17.5°, \alpha_0-10°, \alpha_0-2.5°, \alpha_0+5°, \alpha_0+12.5°, \alpha_0+20°, \alpha_0+27.5°)$. Table 8 illustrates one embodiment of the phase angle set 280 for n=8, where $\alpha_0$ is added to each table cell.

TABLE 8

| | Secondary Winding | | | | | | | |
|---|---|---|---|---|---|---|---|---|
| | 1 | 2 | 3 | 4 | 5 | 6 | 7 | 8 |
| Group A | −27.5° | −20° | −12.5° | −5° | +2.5° | +10° | +17.5° | +25° |
| Group B | −30° | −22.5° | −15° | −7.5° | 0° | +7.5° | +15° | +22.5° |
| Group C | −25° | −17.5° | −10° | −2.5° | +5° | +12.5° | +20° | +27.5° |

The harmonic cancellation pattern at the transformer primary-side input may be of 144-pulse. The harmonic cancellation pattern within each secondary winding group 113 may be of 48-pulse.

In a certain embodiment, the number n of secondary windings 114 in each secondary winding group 113 is 9. The phase angle sets 280 of the three secondary winding groups 113 may be $(\alpha_0-26.67°, \alpha_0-20°, \alpha_0-13.33°, \alpha_0-6.67°, \alpha_0+0°, \alpha_0+6.67°, \alpha_0+13.33°, \alpha_0+20°, \alpha_0+26.67°)$, $(\alpha_0-28.89°, \alpha_0-2.22°, \alpha_0-15.56°, \alpha_0-8.89°, \alpha_0-2.22°, \alpha_0+4.44°, \alpha_0+1.11°, \alpha_0+17.78°, \alpha_0+24.44°)$ and $(\alpha_0-24.44°, \alpha_0-17.78°, \alpha_0+1.11°, \alpha_0-4.44°, \alpha_0+2.22°, \alpha_0+8.89°, \alpha_0+15.56°, \alpha_0+2.22°, \alpha_0+28.89°)$. Table 9 illustrates one embodiment of the phase angle set 280 for n=9, where $\alpha_0$ is added to each table cell and the table cell number is in degrees.

TABLE 9

| | Secondary Winding | | | | | | | | |
|---|---|---|---|---|---|---|---|---|---|
| | 1 | 2 | 3 | 4 | 5 | 6 | 7 | 8 | 9 |
| Group A | −26.67 | −20 | −13.33 | −6.67 | 0 | 6.67 | 13.33 | 20 | 26.67 |
| Group B | −28.89 | −2.22 | −15.56 | −8.89 | 2.22 | 4.44 | 1.11 | 17.78 | 24.44 |
| Group C | −24.44 | −17.78 | −1.11 | −4.44 | 2.22 | 8.89 | 15.56 | 2.22 | 28.89 |

The harmonic cancellation pattern at the transformer primary-side input may be of 162-pulse. The harmonic cancellation pattern within each secondary winding group 113 may be of 54-pulse.

In one embodiment, the number n of secondary windings 114 in each secondary winding group 113 is 10. The phase angle sets 280 of the three secondary winding groups 113 may be $(\alpha_0-28°, \alpha_0-22°, \alpha_0-16°, \alpha_0-10°, \alpha_0-4°, \alpha_0+2°, \alpha_0+8°, \alpha_0+14°, \alpha_0+20°, \alpha_0+26°)$, $(\alpha_0-30°, \alpha_0-24°, \alpha_0-18°, \alpha_0-12°, \alpha_0-6°, \alpha_0+0°, \alpha_0+6°, \alpha_0+12°, \alpha_0+18°, \alpha_0+24°)$, and $(\alpha_0-26°, \alpha_0-20°, \alpha_0-14°, \alpha_0-8°, \alpha_0-2°, \alpha_0+4°, \alpha_0+10°, \alpha_0+16°, \alpha_0+22°, \alpha_0+28°)$. Table 10 illustrates one embodiment of the phase angle set 280 for n=10, where $\alpha_0$ is added to each table cell and the table cell number is in degrees.

TABLE 10

| | Secondary Winding | | | | | | | | | |
|---|---|---|---|---|---|---|---|---|---|---|
| | 1 | 2 | 3 | 4 | 5 | 6 | 7 | 8 | 9 | 10 |
| Group A | −28 | −22 | −16 | −10 | −4 | 2 | 8 | 14 | 20 | 26 |
| Group B | −30 | −24 | −18 | −12 | −6 | 0 | 6 | 12 | 18 | 24 |
| Group C | −26 | −20 | −14 | −8 | −2 | 4 | 10 | 16 | 22 | 28 |

The harmonic cancellation pattern at the transformer primary-side input may be of 180-pulse. The harmonic cancellation pattern within each secondary winding group 113 may be of 60-pulse.

In a certain embodiment, the number n of secondary windings 114 in each secondary winding group 113 is 11. The phase angle sets 280 of the three secondary winding groups 113 may be $(\alpha_0-27.27°, \alpha_0-21.82°, \alpha_0-16.36°,$ $\alpha_0-10.91°$, $\alpha_0-5.45°$, $\alpha_0-0°$, $\alpha_0+5.45°$, $\alpha_0+10.91°$, $\alpha_0+16.36°$, $\alpha_0+21.82°$, $\alpha_0+27.27°$), ($\alpha_0-29.09°$, $\alpha_0-23.64°$, $\alpha_0-18.18°$, $\alpha_0-12.73°$, $\alpha_0-7.27°$, $\alpha_0-1.82°$, $\alpha_0+3.64°$, $\alpha_0+9.09°$, $\alpha_0+14.55°$, $\alpha_0+20°$, $\alpha_0+25.45°$) and ($\alpha_0-25.45°$, $\alpha_0-20°$, $\alpha_0-14.55°$, $\alpha_0-9.09°$, $\alpha_0-3.64°$, $\alpha_0+1.82°$, $\alpha_0+7.27°$, $\alpha_0+12.73°$, $\alpha_0+18.18°$, $\alpha_0+23.64°$, $\alpha_0+29.09°$). Tables 11A-B illustrate one embodiment of the phase angle set 280 for n=11, where $\alpha_0$ is added to each table cell and the table cell number is in degrees.

TABLE 11A

| | Secondary Winding | | | | | |
|---|---|---|---|---|---|---|
| | 1 | 2 | 3 | 4 | 5 | 6 |
| Group A | −27.27 | −21.82 | −16.36 | −10.91 | −5.45 | 0 |
| Group B | −29.09 | −23.64 | −18.18 | −12.73 | −7.27 | −1.82 |
| Group C | −25.45 | −20 | −14.55 | −9.09 | −3.64 | 1.82 |

TABLE 11B

| | Secondary Winding | | | | |
|---|---|---|---|---|---|
| | 7 | 8 | 9 | 10 | 11 |
| Group A | 5.45 | 10.91 | 16.36 | 21.82 | 27.27 |
| Group B | 3.64 | 9.09 | 14.55 | 20 | 25.45 |
| Group C | 7.27 | 12.73 | 18.18 | 23.64 | 29.09 |

The harmonic cancellation pattern at the transformer primary-side input may be of 198-pulse. The harmonic cancellation pattern within each secondary winding group 113 may be of 66-pulse.

In one embodiment, the number n of secondary windings 114 in each secondary winding group 113 is 12. The phase angle sets 280 of the three secondary winding groups 113 may be ($\alpha_0-26.67°$, $\alpha_0-21.67°$, $\alpha_0-16.67°$, $\alpha_0-11.67°$, $\alpha_0-6.67°$, $\alpha_0-1.67°$, $\alpha_0+3.33°$, $\alpha_0+8.33°$, $\alpha_0+13.33°$, $\alpha_0+18.33°$, $\alpha_0+23.33°$, $\alpha_0+28.33°$), ($\alpha_0-28.33°$, $\alpha_0-23.33°$, $\alpha_0-18.33°$, $\alpha_0-13.33°$, $\alpha_0-8.33°$, $\alpha_0-3.33°$, $\alpha_0+1.67°$, $\alpha_0+6.67°$, $\alpha_0+11.67°$, $\alpha_0+16.67°$, $\alpha_0+21.67°$, $\alpha_0+26.67°$), and ($\alpha_0-25°$, $\alpha_0-20°$, $\alpha_0-15°$, $\alpha_0-10°$, $\alpha_0-5°$, $\alpha_0+0°$, $\alpha_0+5°$, $\alpha_0+10°$, $\alpha_0+15°$, $\alpha_0+20°$, $\alpha_0+25°$, $\alpha_0+30°$). Tables 12A-B illustrate one embodiment of the phase angle set 280 for n=12, where $\alpha_0$ is added to each table cell and the table cell number is in degrees.

TABLE 12A

| | Secondary Winding | | | | | |
|---|---|---|---|---|---|---|
| | 1 | 2 | 3 | 4 | 5 | 6 |
| Group A | −26.67 | −21.67 | −16.67 | −11.67 | −6.67 | −1.67 |
| Group B | −28.33 | −23.33 | −18.33 | −13.33 | −8.33 | −3.33 |
| Group C | −25 | −20 | −15 | −10 | −5 | 0 |

TABLE 12B

| | Secondary Winding | | | | | |
|---|---|---|---|---|---|---|
| | 7 | 8 | 9 | 10 | 11 | 12 |
| Group A | 3.33 | 8.33 | 13.33 | 18.33 | 23.33 | 28.33 |
| Group B | 1.67 | 6.67 | 11.67 | 16.67 | 21.67 | 26.67 |
| Group C | 5 | 10 | 15 | 20 | 25 | 30 |

The harmonic cancellation pattern at the transformer primary-side input may be of 216-pulse. The harmonic cancellation pattern within each secondary winding group 113 may be of 72-pulse.

In one embodiment, the m secondary winding groups 113 of secondary windings 114 are split and built into m transformers 116 for the power conversion system 100 of FIG. 1B. Within the secondary windings 114 of each of the m transformers 116, a phase angle set 280 of the secondary windings 114 may be selected that shifts the secondary winding phases 260 from each other by a secondary winding phase shift δ 265 to form a 6×n pulse harmonics cancellation pattern in the primary line current of each phase shifting transformer 116. The secondary winding phase shift δ 265 may be calculated using Equation 2, where n is the number of secondary windings 114 of each transformer 116.

The phase angle sets 280 of the secondary winding groups 113 of the m transformers 116 may be all different with a non-zero GPS 270 between the corresponding secondary windings 114 of any two transformers 116. The GPS 270 may be calculated using Equation 1, where k is any integer that is not a multiple of m and m is the number of phase shifting transformers 116 and secondary winding groups 113. The harmonic cancellation pattern at the point of common coupling (PCC) of the transformers 116 may be of 6×m×n pulse.

In one embodiment, the primary windings 111 of the m phase shifting transformers 116 of FIG. 1B all have the same primary phase angles. The GPS 270 is calculated as shown in Equation 3, where k is an integer and m is the number of phase shifting transformers 116 or secondary winding groups 113.

$$GPS = k\delta/m \qquad \text{Equation 3}$$

In one embodiment, the primary windings 111 of the m phase shifting transformers are phase shifted by the phase shift angle kδ/m from each other. All the secondary windings 114 may have the phase shifting angles sets of Tables 1-12B corresponding to a number n of secondary windings 114.

Figure 1D:
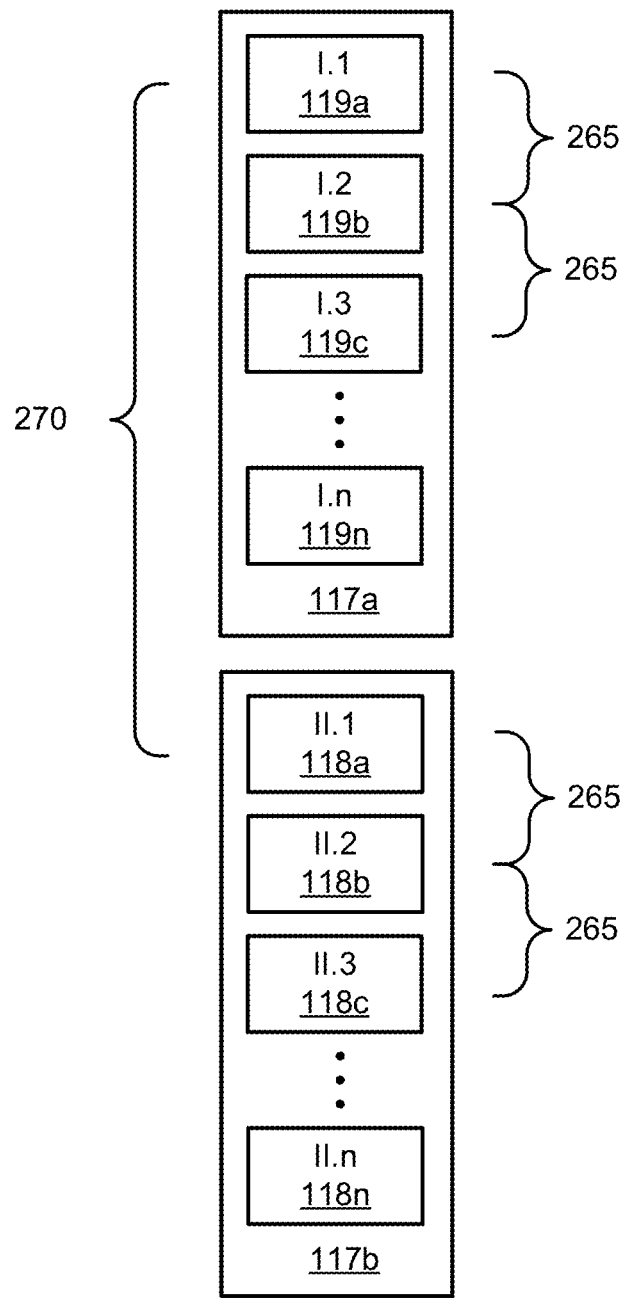
FIG. 1D is a schematic block diagram of virtual secondary winding groups according to an embodiment.

FIG. 1D is a schematic block diagram where the secondary windings are divided into m=2 virtual groups 117a-b according to an embodiment. In the depicted embodiment, the secondary windings 114 of FIGS. 1A-B are demarked as a plurality of n secondary windings 118/119 that are organized into one of two virtual secondary winding groups 117 with an arrangement of phase angle shifts 260 that will be described hereafter.

Figure 1E:
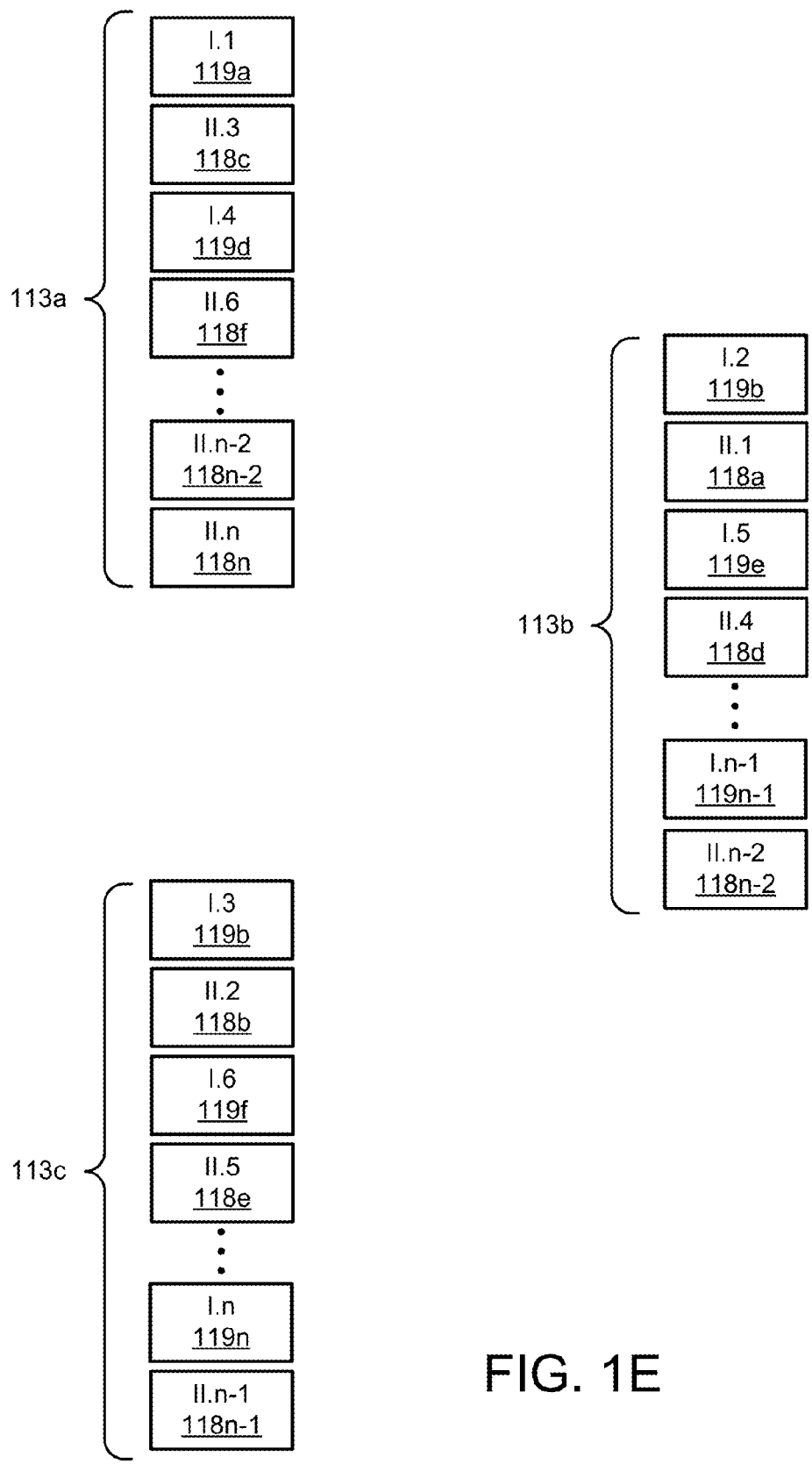
FIG. 1E is a schematic block diagram of secondary winding groups according to an embodiment.

FIG. 1E is a schematic block diagram showing the pattern of using the secondary windings 118/119 of the two virtual secondary winding groups 117a-b to form three secondary winding groups 113a-c for a three phase power conversion system 100 according to an embodiment. In the depicted embodiment, the plurality of n secondary windings 118/119 of the two virtual secondary winding groups 117a-b of FIG. 1D are organized into three secondary winding groups 113a-c. The embodiments may be practiced with other distributions of the secondary windings 118/119 into secondary winding groups 113.

The phase angle set 280 of the secondary windings 118/119 may be selected that shifts the secondary winding phases 260 from each other secondary winding phase 260 by a secondary winding phase shift angle δ 265 to form a 6×n pulse harmonics cancellation pattern within each virtual secondary winding group 117. The secondary winding phase shift angle δ 265 may be calculated using Equation 4, where m is the number of secondary winding groups 113 comprising the original secondary windings 114 and n is the number of secondary windings 114 in the secondary winding groups 113.

$$\delta = 60°/(0.5 m \times n)$$ Equation 4

The phase angle sets 280 of the virtual secondary winding groups 117a-b may be shifted by kδ/2, where k is any integer number. In one embodiment, the number m of the virtual secondary winding groups 113 is 2 and the number k equals an odd number. The harmonics cancellation pattern at the transformer primary-side input may be of 18×n pulse.

Alternatively, the number m of the virtual secondary winding groups 113 may be 2 and the number k equals an even number. The harmonics cancellation pattern at the transformer primary-side input may be of 9×n pulse.

In a certain embodiment, the number k equals zero and the two virtual secondary winding groups 117 have the same phase shift angle sets. The harmonics cancellation pattern at the transformer primary-side input may be of 9×n pulse.

In one embodiment, the number n of the secondary windings 114 in each of the three secondary winding groups 113 is 4. The phase angle sets 280 of the three secondary winding groups 113 may be ($\alpha_0-25°$, $\alpha_0-5°$, $\alpha_0+5°$, $\alpha_0+25°$), ($\alpha_0-15°$, $\alpha_0-5°$, $\alpha_0+15°$, $\alpha_0+25°$), and ($\alpha_0-25°$, $\alpha_0-15°$, $\alpha_0+5°$, $\alpha_0+15°$), wherein $\alpha_0$ is the arbitrary offset angle. Table 13 illustrates one embodiment of the phase angle set 280 for n=4.

TABLE 13

| | Secondary Winding | | | |
|---|---|---|---|---|
| | 1 | 2 | 3 | 4 |
| Group A | $\alpha_0 - 25°$ | $\alpha_0 - 5°$ | $\alpha_0 + 5°$ | $\alpha_0 + 25°$ |
| Group B | $\alpha_0 - 15°$ | $\alpha_0 - 5°$ | $\alpha_0 + 15°$ | $\alpha_0 + 25°$ |
| Group C | $\alpha_0 - 25°$ | $\alpha_0 - 15°$ | $\alpha_0 + 5°$ | $\alpha_0 + 15°$ |

The harmonic cancellation pattern at the transformer primary-side input may be 36-pulse. The harmonic cancellation of each of the three secondary winding groups 113 may be at least 12-pulse.

In a certain embodiment, the number n of the secondary windings 114 in each of the three secondary winding groups 113 is 6. The phase angle sets 280 of the three secondary winding groups 113 may be ($\alpha_0-26.67°$, $\alpha_0-13.33°$, $\alpha_0-6.67°$, $\alpha_0+6.67°$, $\alpha_0+13.33°$, $\alpha_0+26.67$), ($\alpha_0-20°$, $\alpha_0-13.33°$, $\alpha_0+0°$, $\alpha_0+6.67°$, $\alpha_0+20°$, $\alpha_0+26.67$), and ($\alpha_0-26.67°$, $\alpha_0-20°$, $\alpha_0-6.67°$, $\alpha_0+0°$, $\alpha_0+13.33°$, $\alpha_0+20$). Table 14 illustrates one embodiment of the phase angle set 280 for n=6.

TABLE 14

| | Secondary Winding | | | | | |
|---|---|---|---|---|---|---|
| | 1 | 2 | 3 | 4 | 5 | 6 |
| Group A | $\alpha_0 - 26.67°$ | $\alpha_0 - 13.33°$ | $\alpha_0 - 6.67°$ | $\alpha_0 + 6.67°$ | $\alpha_0 + 13.33°$ | $\alpha_0 + 26.67°$ |
| Group B | $\alpha_0 - 20°$ | $\alpha_0 - 13.33°$ | $\alpha_0 + 0°$ | $\alpha_0 + 6.67°$ | $\alpha_0 + 20°$ | $\alpha_0 + 26.67°$ |
| Group C | $\alpha_0 - 26.67°$ | $\alpha_0 - 20°$ | $\alpha_0 - 6.67°$ | $\alpha_0 + 0°$ | $\alpha_0 + 13.33°$ | $\alpha_0 + 20°$ |

The harmonic cancellation pattern at the transformer primary-side input may be 54-pulse. The harmonic cancellation of each of the three secondary winding groups 113 is at least 18-pulse.

In one embodiment, the number n of the secondary windings 114 in each of the three secondary winding groups 113 is 8 and the phase angle sets 280 of the three secondary winding groups 113 are ($\alpha_0+30°$, $\alpha_0+20°$, $\alpha_0+15°$, $\alpha_0+5°$, $\alpha_0+0°$, $\alpha_0-10°$, $\alpha_0-15°$, $\alpha_0-25°$), ($\alpha_0+30°$, $\alpha_0+25°$, $\alpha_0+15°$, $\alpha_0+10°$, $\alpha_0+0°$, $\alpha_0-5°$, $\alpha_0-15°$, $\alpha_0-20°$), and ($\alpha_0+25°$, $\alpha_0+20°$, $\alpha_0+10°$, $\alpha_0+5°$, $\alpha_0-5°$, $\alpha_0-10°$, $\alpha_0-20°$, $\alpha_0-25°$). Table 15 illustrates one embodiment of the phase angle set 280 for n=8, where $\alpha_0$ is added to each table cell.

TABLE 15

| | Secondary Winding | | | | | | | |
|---|---|---|---|---|---|---|---|---|
| | 1 | 2 | 3 | 4 | 5 | 6 | 7 | 8 |
| Group A | +30° | +20° | +15° | +5° | 0° | -10° | -15° | -25° |
| Group B | +30° | +25° | +15° | +10° | 0° | -5° | -15° | -20° |
| Group C | +25° | +20° | +10° | +5° | -5° | -10° | -20° | -25° |

The harmonic cancellation pattern at the transformer primary-side input may be 72-pulse. The harmonic cancellation of each of the three secondary winding groups 113 may be at least 24-pulse.

In a certain embodiment, the number n of the secondary windings 114 in each of the three secondary winding groups 113 is 10. The phase angle sets 280 of the three secondary winding groups 113 may be ($\alpha_0+28°$, $\alpha_0+20°$, $\alpha_0+16°$, $\alpha_0+8°$, $\alpha_0+4°$, $\alpha_0-4°$, $\alpha_0-8°$, $\alpha_0-16°$, $\alpha_0-20°$, $\alpha_0-28°$), ($\alpha_0+28°$, $\alpha_0+24°$, $\alpha_0+16°$, $\alpha_0+12°$, $\alpha_0+4°$, $\alpha_0+0°$, $\alpha_0-8°$, $\alpha_0-12°$, $\alpha_0-20°$, $\alpha_0-24°$), and ($\alpha_0+24°$, $\alpha_0+20°$, $\alpha_0+12°$, $\alpha_0+8°$, $\alpha_0+0°$, $\alpha_0-4°$, $\alpha_0-12°$, $\alpha_0-16°$, $\alpha_0-24°$, $\alpha_0-28°$). Table 16 illustrates one embodiment of the phase angle set 280 for n=10, where $\alpha_0$ is added to each table cell.

TABLE 16

| | Secondary Winding | | | | | | | | | |
|---|---|---|---|---|---|---|---|---|---|---|
| | 1 | 2 | 3 | 4 | 5 | 6 | 7 | 8 | 9 | 10 |
| Group A | +28° | +20° | +16° | +8° | +4° | −4° | −8° | −16° | −20° | −28° |
| Group B | +28° | +24° | +16° | +12° | +4° | 0° | −8° | −12° | −20° | −24° |
| Group C | +24° | +20° | +12° | +8° | 0° | −4° | −12° | −16° | −24° | −28° |

The harmonic cancellation pattern at the transformer primary-side input may be 90-pulse. The harmonic cancellation of each of the three secondary winding groups 113 may be at least 30-pulse.

In one embodiment, the number n of the secondary windings 114 in each of the 3 secondary winding groups 100 is 12. The phase angle sets 280 of the three secondary winding group 113 may be ($\alpha_0$+28.33°, $\alpha_0$+21.67°, $\alpha_0$+18.33°, $\alpha_0$+11.67°, $\alpha_0$+8.33°, $\alpha_0$+1.67°, $\alpha_0$−1.67°, $\alpha_0$−8.33°, $\alpha_0$−11.67°, $\alpha_0$−18.33°, $\alpha_0$−21.67°, $\alpha_0$−28.33°), ($\alpha_0$+28.33°, $\alpha_0$+25°, $\alpha_0$+18.33°, $\alpha_0$+15°, $\alpha_0$+8.33°, $\alpha_0$+5°, $\alpha_0$−1.67°, $\alpha_0$−5°, $\alpha_0$−11.67°, $\alpha_0$−15°, $\alpha_0$−21.67°, $\alpha_0$−25°), and ($\alpha_0$+25°, $\alpha_0$+21.67°, $\alpha_0$+15°, $\alpha_0$+11.67°, $\alpha_0$+5°, $\alpha_0$+1.67°, $\alpha_0$−5°, $\alpha_0$−8.33°, $\alpha_0$−15°, $\alpha_0$−18.33°, $\alpha_0$−25°, $\alpha_0$−28.33°). Tables 17A-B illustrate one embodiment of the phase angle set 280 for n=12, where $\alpha_0$ is added to each table cell and each value is in degrees.

TABLE 17A

| | Secondary Winding | | | | | |
|---|---|---|---|---|---|---|
| | 1 | 2 | 3 | 4 | 5 | 6 |
| Group A | 28.33 | 21.67 | 18.33 | 11.67 | 8.33 | 1.67 |
| Group B | 28.33 | 25 | 18.33 | 15 | 8.33 | 5 |
| Group C | 25 | 21.67 | 15 | 11.67 | 5 | 1.67 |

TABLE 17B

| | Secondary Winding | | | | | |
|---|---|---|---|---|---|---|
| | 7 | 8 | 9 | 10 | 11 | 12 |
| Group A | −1.67 | −8.33 | −11.67 | −18.33 | −21.67 | −28.33 |
| Group B | −1.67 | −5 | −11.67 | −15 | −21.67 | −25 |
| Group C | −5 | −8.33 | −15 | −18.33 | −25 | −28.33 |

The harmonic cancellation pattern at the transformer primary-side input may be 108-pulse. The harmonic cancellation of each of the three secondary winding groups 113 may be at least 36-pulse.

Figure 2A:
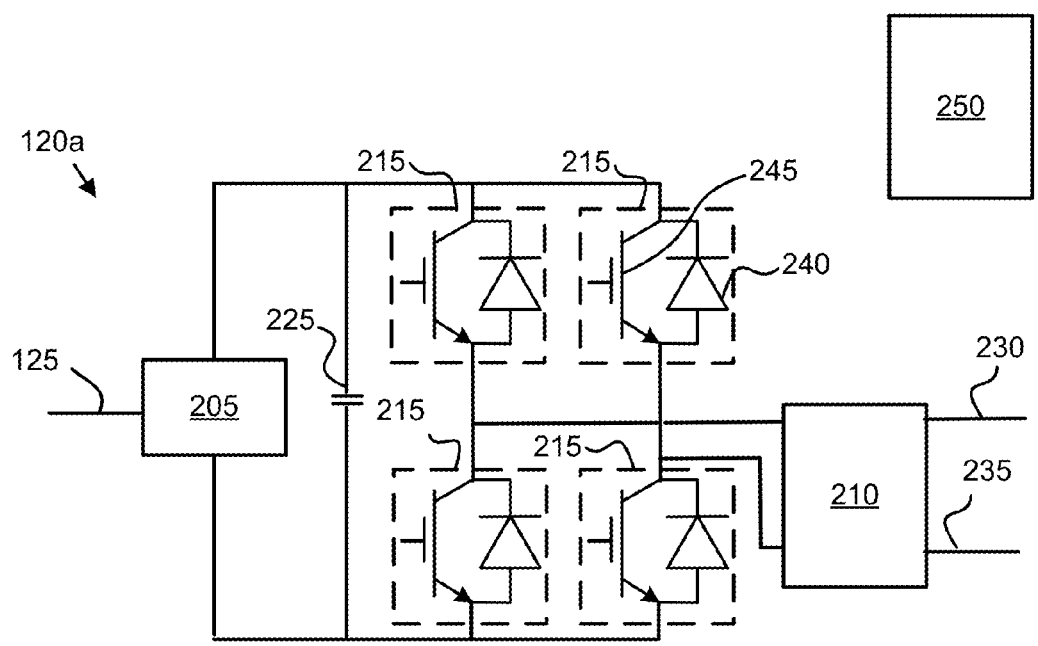
FIG. 2A is a schematic diagram of a cascaded H bridge power converter according to an embodiment.

FIG. 2A is a schematic diagram of a cascaded H bridge power converter 120a according to an embodiment. In the depicted embodiment, the cascaded H-bridge (CHB) power converter 120a includes the power converter input 125 from the secondary windings 114 as shown in FIGS. 1A-B, a rectifier 205, a capacitor 225, one or more switches 215, a controller 250, and DC outputs 230/235. Each switch 215 may include a transistor 245 and a diode 240. The controller 250 may activate and deactivate the switches 215 to generate an AC output 230/235 with variable amplitude and frequency.

Each power converter 120a may include a bypass controller 210. The bypass controller 210 may short the outputs 230/235. At least two bypass controllers 210 may short the outputs of at least two power converters 120 in response to failure of a first power converter 120.

Figure 2B:
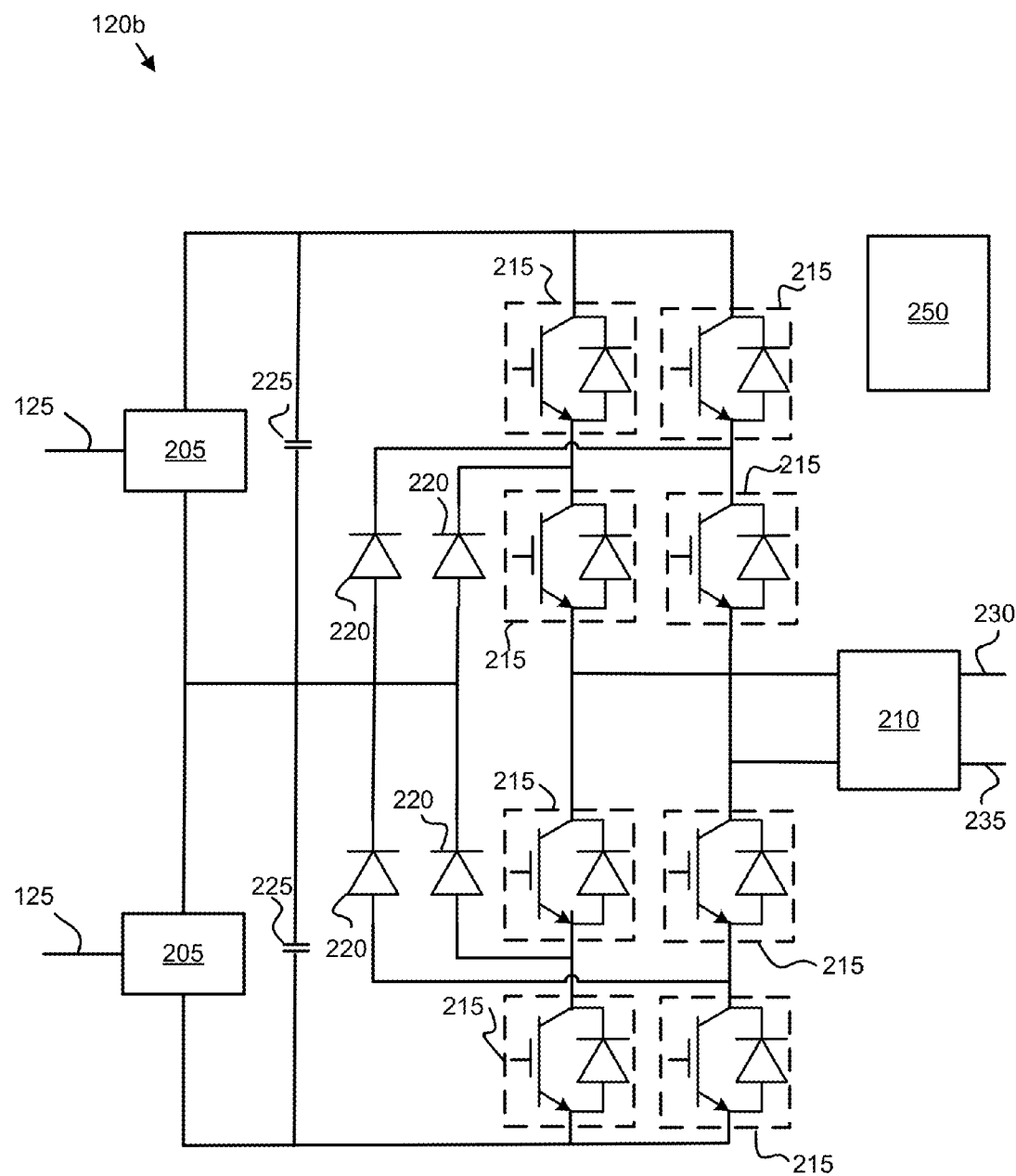
FIG. 2B is a schematic diagram of a cascaded neutral point clamp power converter according to an embodiment.

FIG. 2B is a schematic diagram of a cascaded neutral point clamped (NPC) power converter 120b according to an embodiment. In the depicted embodiment, the cascaded NPC power converter 120b includes the power converter inputs 125, one or more rectifiers 205, one or more capacitors 225, one or more diodes 220, the controller 250, one or more switches 215, and an AC output 230/235. The controller 250 may activate and deactivate the switches 215 to generate the AC output 230/235 from the AC current with variable amplitude and frequency. Each power converter 120b may include the bypass controller 210. The bypass controller 210 may short the AC outputs 230/235.

The cascaded H-bridge and cascaded NPC bridge based power converters 125a-b are shown as exemplary power converters 125. Other power converter architectures may be employed.

FIG. 3 is a table of generic secondary winding phases 260 for virtual secondary winding groups 117 according to an embodiment. The secondary winding phases 260 are shown for n secondary windings 114 as a function of the secondary winding phase shift δ 265. Each cell value corresponds to the secondary winding phase 260 of the corresponding virtual secondary winding group 117a-b and secondary winding 114-1:n, where γ is the GPS 270.

FIG. 4 is a table of virtual secondary winding group organization according to an embodiment. The distribution of n secondary windings 114 from two virtual secondary winding groups 117a-b into A-B-C three secondary winding groups 113 is illustrated. For example, a first secondary winding 114-1 of a first virtual secondary winding group 117a may be assigned to a secondary winding group 113 designated by 'A,' with other secondary windings 114 assigned to secondary winding groups 113 designated by 'B' and 'C' as indicated. The embodiments may be practiced with other distributions of the secondary windings 114.

FIG. 5A is a table of an exemplary secondary winding organization according to the prior art. The secondary winding phases 260 are shown for a power conversion system, referred to hereafter as prior art power conversion system A, of the prior art with three secondary winding groups 113 that each comprise four secondary windings 114. Simulated results for the prior art power conversion system A will be shown hereafter.

FIG. 5B is a table of an exemplary secondary winding organization according to an embodiment. The secondary winding phases 260 for a power conversion system 100 of FIG. 1A, referred to hereafter as power conversion system A prime, are shown. Power conversion system A prime includes three secondary winding groups 113 that each comprise four secondary windings 114. Simulated results for the power conversion system A prime will be shown hereafter.

FIG. 5C is a table of phase angles and normalized spectra of the secondary-winding harmonic currents referred in a transformer primary-side input for harmonic order h=1-73 according to FIG. 5A for the prior art power conversion system A. Rows 1-12 330 show the phase angles of harmonics currents of each secondary winding 114 referred to the primary winding 111. Rows 13-15 320 show the vectoral sum of individual referred harmonic currents for groups 113a-c. Row 16 335 is the vectoral sum of all the referred harmonics from the three groups 113a-c. Row 16 335 is also the spectrum of the input line current 130 of the prior art power conversion system A. The sums are normalized to the spectrum of the referred current from a single secondary winding 114. As shown, the $23^{rd}$ and $25^{th}$ harmonics for the currents of each secondary winding group 113a-c and currents 130 of the primary winding 111 are not cancelled. This is a traditional 24-pulse harmonic cancellation pattern of the prior art.

FIG. 5D is a table of phase angles and normalized spectra of the secondary-winding harmonic currents referred in the primary-side according to FIG. 5B for the power conversion system A prime according to an embodiment. Rows 1-12 330 show the phase angles of harmonics currents of each secondary winding 114 referred to the primary winding 111. Rows 13-15 320 show the vectoral sum of individual referred harmonic currents for groups 113a-c. Row 16 335 is the vectoral sum of all the referred harmonics from the three groups 113a-c. Row 16 335 is also the spectrum of the input line current 130 of the exemplary power conversion system A prime. The sums are normalized to the spectrum of the referred current from a single secondary winding 114. As shown, the $23^{rd}$ and $25^{th}$ harmonics for the currents of each secondary winding group 113a-c are not cancelled, resulting in a 24-pulse cancellation pattern. However, all of the harmonics from $5^{th}$ to $67^{th}$ are cancelled in current 130 of the primary winding 111, leaving $71^{st}$ and $73^{rd}$ are the lowest harmonics that are not cancelled, which is a 72-pulse harmonic cancellation, comparing to the 24-pulse cancellation pattern in the exemplary prior art power conversion system A.

Figure 5E:
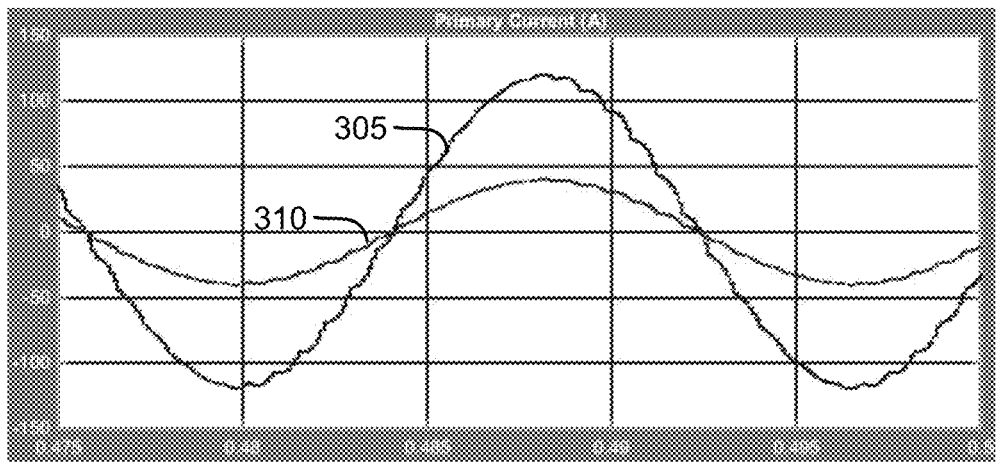
FIG. 5E is a graph of power converter current according to the prior art.

FIGS. 5E-H are simulation results with a 100% load on the power conversion system 100. FIG. 5E is a graph of power converter current according to the prior art. The graph shows the simulated power converter input current 305 and the summation of the referred currents 310 of secondary winding groups 113 for the exemplary prior art power conversion system A. The converter input current 305 includes pronounced ripples due to the un-canceled $23^{rd}$ and $25^{th}$ harmonics.

Figure 5F:
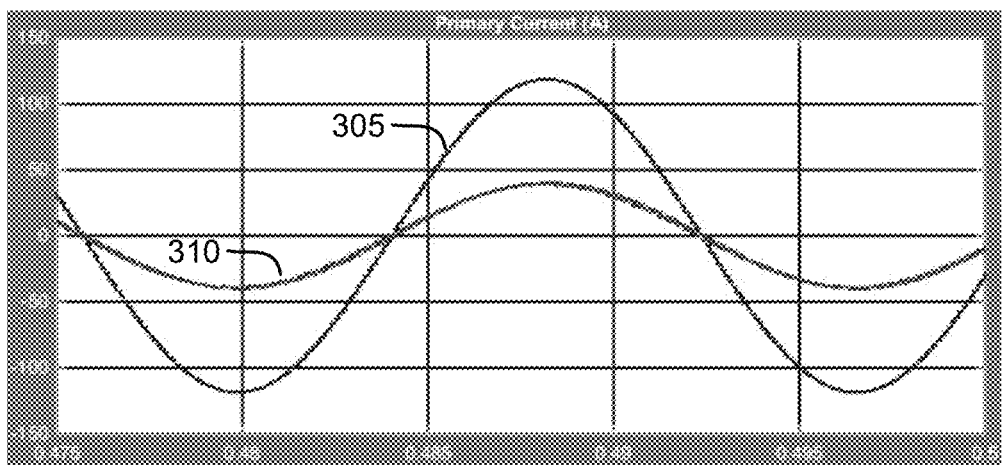
FIG. 5F is a graph of power converter current according to an embodiment.

FIG. 5F is a graph of power converter current of the exemplary power conversion system A prime according to an embodiment. The graph shows the simulated converter input current 305 and the summation of the referred currents 310 of secondary winding groups. Because of the 72-pulse cancellation pattern in the primary as shown in FIG. 5D, the ripples in the converter input current 305 are significantly reduced over the prior art power conversion system A.

Figure 5G:
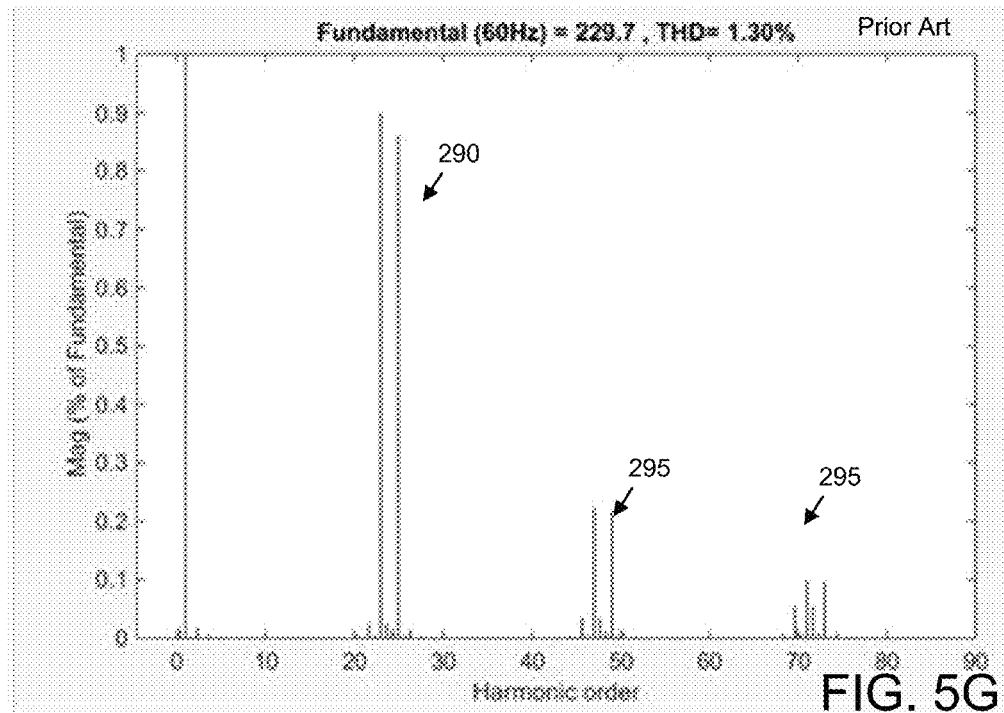
FIG. 5G is a graph of a harmonics spectrum of a power converter input current according to the prior art.

FIG. 5G is a graph of a primary-winding current spectrum according to the prior art power conversion system A. The dominant harmonics 290 are $23^{rd}$ and $25^{th}$.

Figure 5H:
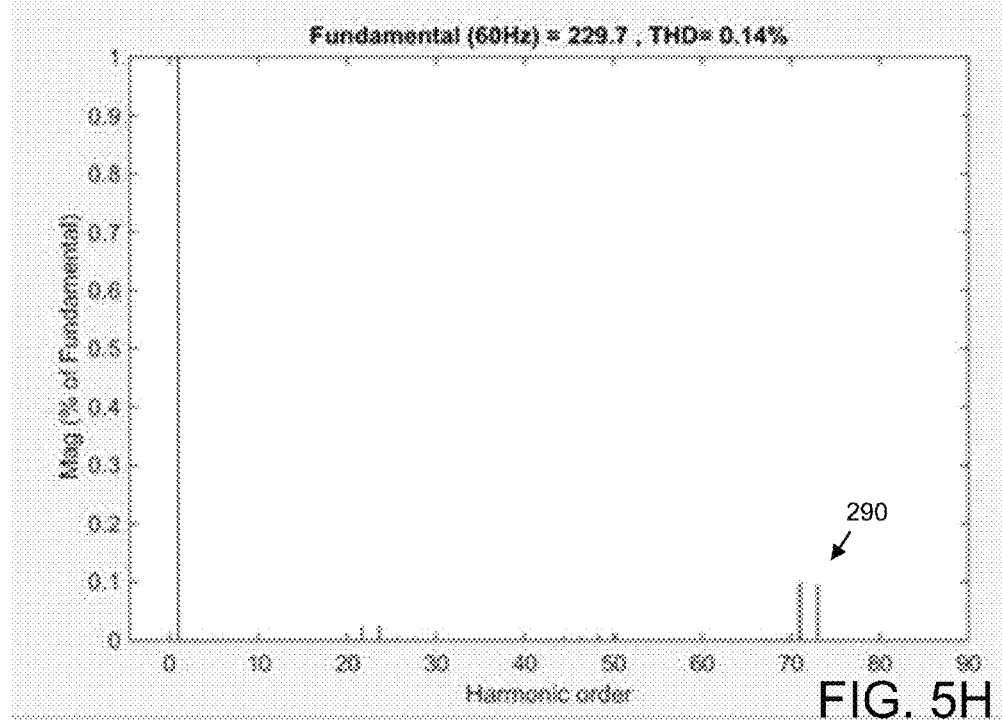
FIG. 5H is a graph of a harmonics spectrum of a power converter input current according to an embodiment.

FIG. 5H is a graph of a primary-winding current spectrum of the power conversion system A prime according to an exemplary embodiment. The dominant harmonics 290 are $71^{st}$ and $73^{rd}$. As illustrated in FIG. 5D, other lower order harmonics are significantly cancelled. In addition, the $71^{st}$ and $73^{rd}$ harmonics are significantly lower in magnitude comparing to the magnitudes of the $23^{rd}$ and $25^{th}$ harmonics of the prior art.

Figure 5I:
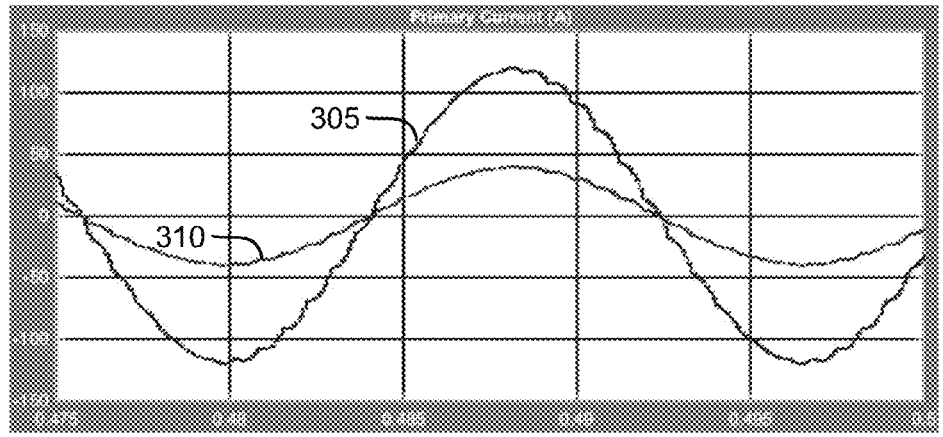
FIG. 5I is a graph of a power converter current according to the prior art.

FIGS. 5I-5L are simulation results for a 50-60% load on the power conversion system 100. FIG. 5I is a graph of a power converter current according to the prior art. The graph shows the converter input current 305 and the sum of the referred current for each of the secondary winding groups 113a-c of the prior art power conversion system A. The converter input current 305 includes pronounced ripples due to the un-canceled $23^{rd}$ and $25^{th}$ harmonics.

Figure 5J:
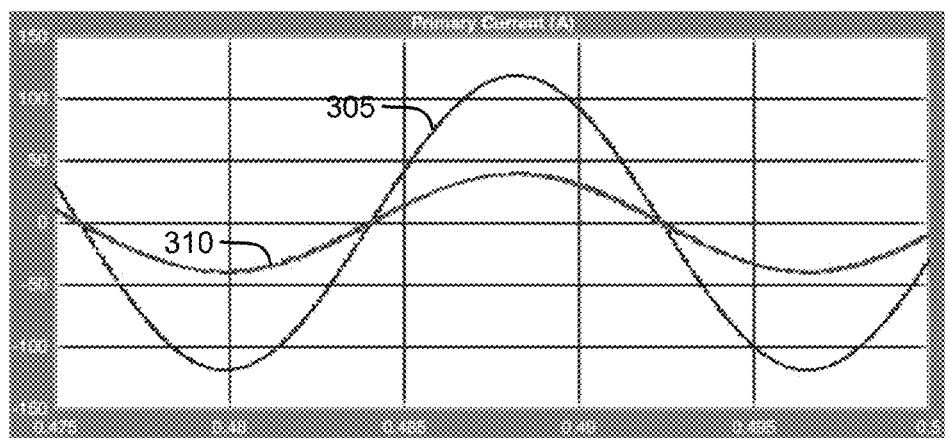
FIG. 5J is a graph of a power converter current according to an embodiment.

FIG. 5J is a graph of a power converter current according to an embodiment. The graph shows the primary current 305 and the sum of the referred current for each of the secondary winding groups 113a-c of the power conversion system A prime. Because of the 72-pulse harmonic cancellation pattern as shown in FIG. 5D, the ripples in the power conversion system input current 305 are significantly reduced over the prior art power conversion system A of FIG. 5I.

Figure 5K:
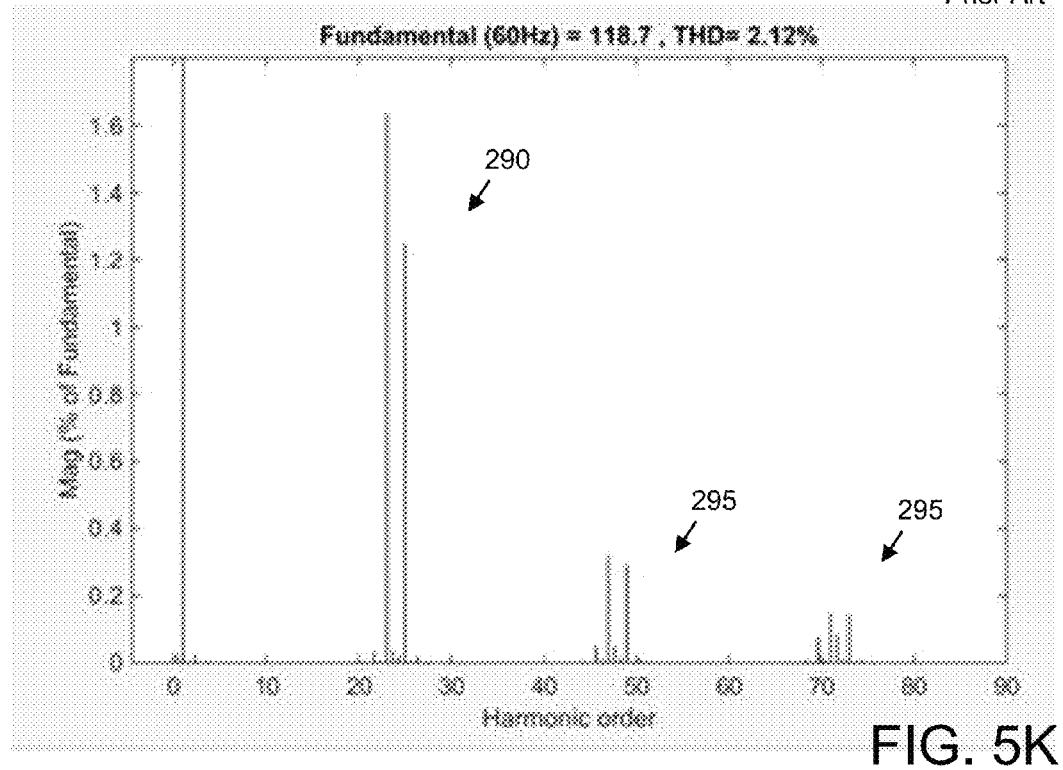
FIG. 5K is a graph of a harmonics spectrum of the converter input current according to the prior art.

FIG. 5K is a graph of a harmonics spectrum of the converter input current of the prior art power conversion system A for the 50-60% load. The dominant harmonics 290 are $23^{rd}$ and $25^{th}$.

Figure 5L:
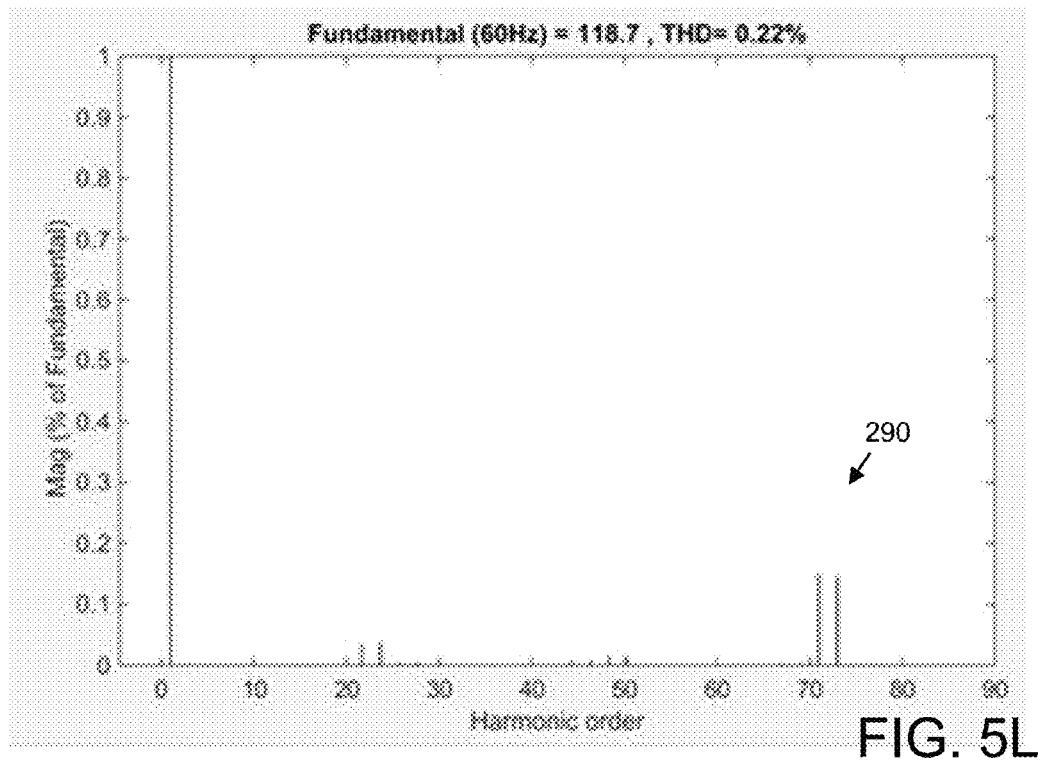
FIG. 5L is a graph of a harmonics spectrum of the converter input current according to an embodiment.

FIG. 5L is a graph of a harmonics spectrum of the converter input current of the power conversion system A prime for a 50-60% load according to an exemplary embodiment. The dominant harmonics 290 are $71^{st}$ and $73^{rd}$. As illustrated in FIG. 5D, other lower order harmonics are significantly cancelled. In addition, the $71^{st}$ and $73^{rd}$ harmonics are significantly lower in magnitude compared to the magnitudes of the $23^{rd}$ and $25^{th}$ harmonics in prior art of FIG. 5K.

By selecting the phase angle sets 280 of the embodiments for converter systems with multiple-secondary-winding phase shifting transformers, harmonic cancellation pattern in the converter input current or in the current at PCC can be significantly improved comparing to prior arts. The embodiments can also be used to achieve the same or better harmonics cancellation pattern with fewer numbers of transformer secondary windings and power converter cells.

This description uses examples to disclose the invention and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:
1. A power conversion system comprising:
a plurality of power converters;
a phase shifting transformer comprising 3-phase primary windings and a core;
a plurality of 3 secondary winding groups, wherein each of the secondary winding groups comprises n secondary windings, n>1, in electromagnetic communication with a corresponding primary winding and feeding the plurality of power converters;
wherein each of the n secondary windings in each secondary winding group each has a secondary winding phase that is shifted from each adjacent secondary winding phase of each adjacent secondary winding within the secondary winding group by a secondary winding phase shift $\delta$, where $\delta=60°/n$;
wherein the secondary winding phases of each secondary winding group form a phase angle set of n secondary winding phases $\alpha, \alpha+\delta, \ldots, \alpha+(n-1)\delta$, where $\alpha$ is a secondary winding offset angle;
wherein $\alpha$ of a first secondary winding group is further offset from the other secondary winding groups by a group phase shift, where the group phase shift equals $k\delta/3$ and k is any integer that is not a multiple of 3;

wherein the phase shifted secondary windings within each secondary winding group form a 6×n pulse harmonics cancellation pattern in a primary line current and an overall harmonic cancellation pattern resulting from the 3 secondary winding groups in a transformer primary-side input is of 18×n pulse.

2. The power conversion system of claim 1, wherein the group phase shift between different secondary winding groups is one of ±δ/3 or ±2δ/3, and secondary winding phase shifts comprise a combination selected from the group consisting of +δ/3 and −δ/3, +δ/3 and 2δ/3, and −δ/3 and −2δ/3.

3. The power conversion system of claim 2, wherein the number n of secondary windings in each secondary winding group is 1 and the phase angle sets of the three secondary winding groups are $(\alpha_0-20°)$, $(\alpha_0+0°)$ and $(\alpha_0+20°)$, wherein $\alpha_0$ is an arbitrary offset angle, and the harmonic cancellation pattern at the transformer primary-side input is of 18-pulse, and the harmonic cancellation pattern within each secondary winding group is of 6-pulse.

4. The power conversion system of claim 2, wherein the number n of secondary windings in each secondary winding group is 2 and the phase angle sets of the three secondary winding groups are $(\alpha_0-25°, \alpha_0+5°)$, $(\alpha_0-15°, \alpha_0+15°)$ and $(\alpha_0-5°, \alpha_0+25°)$, wherein $\alpha_0$ is an arbitrary offset angle, the harmonic cancellation pattern at the transformer primary-side input is of 36-pulse, and the harmonic cancellation pattern within each secondary winding group is of 12-pulse.

5. The power conversion system of claim 2, wherein the number n of secondary windings in each secondary winding group is 3 and phase angle sets of the three secondary winding groups are $(\alpha_0-26.67°, \alpha_0-6.67°, \alpha_0+13.33°)$, $(\alpha_0-20°, \alpha_0+0°, \alpha_0+20°)$ and $(\alpha_0-13.33°, \alpha_0+6.67°, \alpha_0+26.67°)$, wherein $\alpha_0$ is an arbitrary offset angle, the harmonic cancellation pattern at the transformer primary-side input is of 54-pulse, and the harmonic cancellation pattern within each secondary winding group is of 18-pulse.

6. The power conversion system of claim 2, wherein the number n of secondary windings in each secondary winding group is 4 and the phase angle sets of the three secondary winding groups are $(\alpha_0-25°, \alpha_0-10°, \alpha_0+5°, \alpha_0+20°)$, $(\alpha_0-20°, \alpha_0-5°, \alpha_0+10°, \alpha_0+25°)$ and $(\alpha_0-15°, \alpha_0, \alpha_0+15°, \alpha_0+30°)$, wherein $\alpha_0$ is an arbitrary offset angle, the harmonic cancellation pattern at the transformer primary-side input is of 72-pulse, and the harmonic cancellation pattern within each secondary winding group is of 24-pulse.

7. The power conversion system of claim 2, wherein the number n of secondary windings in each secondary winding group is 5 and the phase angle sets of the three secondary winding groups are $(\alpha_0-28°, \alpha_0-16°, \alpha_0-4°, \alpha_0+8°, \alpha_0+20°)$, $(\alpha_0-24°, \alpha_0-12°, \alpha_0+0°, \alpha_0+12°, \alpha_0+24°)$ and $(\alpha_0-20°, \alpha_0-8°, \alpha_0+4°, \alpha_0+16°, \alpha_0+28°)$, wherein $\alpha_0$ is an arbitrary offset angle, the harmonic cancellation pattern at the transformer primary-side input is of 90-pulse, and the harmonic cancellation pattern within each secondary winding group is of 30-pulse.

8. The power conversion system of claim 2, wherein the number n of secondary windings in each secondary winding group is 6 and the phase angle sets of the three secondary winding groups are $(\alpha_0-26.67°, \alpha_0-16.67°, \alpha_0-6.67°, \alpha_0+3.33°, \alpha_0+13.33°, \alpha_0+23.33°)$, $(\alpha_0-30°, \alpha_0-20°, \alpha_0-10°, \alpha_0+0°, \alpha_0+10°, \alpha_0+20°)$ and $(\alpha_0-23.33°, \alpha_0-13.33°, \alpha_0-3.33°, \alpha_0+6.67°, \alpha_0+16.67°, \alpha_0+26.67°)$, wherein $\alpha_0$ is an arbitrary offset angle, the harmonic cancellation pattern at the transformer primary-side input is of 108-pulse, and the harmonic cancellation pattern within each secondary winding group is of 36-pulse.

9. The power conversion system of claim 2, wherein the number n of secondary windings in each secondary winding group is 7 and the phase angle sets of the three secondary winding groups are $(\alpha_0-22.86°, \alpha_0-14.29°, \alpha_0-5.71°, \alpha_0+2.86°, \alpha_0+11.43°, \alpha_0+20°, \alpha_0+28.57°)$, $(\alpha_0-25.71°, \alpha_0-17.14°, \alpha_0-8.57°, \alpha_0+0°, \alpha_0+8.57°, \alpha_0+17.14°, \alpha_0+25.71°)$, $(\alpha_0-28.57°, \alpha_0-20°, \alpha_0-11.43°, \alpha_0-2.86°, \alpha_0+5.71°, \alpha_0+14.29°, \alpha_0+22.86°)$, wherein $\alpha_0$ is an arbitrary offset angle, the harmonic cancellation pattern at the transformer primary-side input is of 126-pulse, and the harmonic cancellation pattern within each secondary winding group is of 42-pulse.

10. The power conversion system of claim 2, wherein the number n of secondary windings in each secondary winding group is 8 and the phase angle sets of the three secondary winding groups are $(\alpha_0-27.5°, \alpha_0-20°, \alpha_0-12.5°, \alpha_0-5°, \alpha_0+2.5°, \alpha_0+10°, \alpha_0+17.5°, \alpha_0+25°)$, $(\alpha_0-30°, \alpha_0-22.5°, \alpha_0-15°, \alpha_0-7.5°, \alpha_0+0°, \alpha_0+7.5°, \alpha_0+15°, \alpha_0+22.5°)$ and $(\alpha_0-25°, \alpha_0-17.5°, \alpha_0-10°, \alpha_0-2.5°, \alpha_0+5°, \alpha_0+12.5°, \alpha_0+20°, \alpha_0+27.5°)$, wherein $\alpha_0$ is an arbitrary offset angle, the harmonic cancellation pattern at the transformer primary-side input is of 144-pulse, and the harmonic cancellation pattern within each secondary winding group is of 48-pulse.

11. The power conversion system of claim 2, wherein the number n of secondary windings in each secondary winding group is 9 and the phase angle sets of the three secondary winding groups are $(\alpha_0-26.67°, \alpha_0-20°, \alpha_0-13.33°, \alpha_0-6.67, \alpha_0+0°, \alpha_0+6.67°, \alpha_0+13.33°, \alpha_0+20°, \alpha_0+26.67°)$, $(\alpha_0-28.89°, \alpha_0-2.22°, \alpha_0-15.56°, \alpha_0-8.89°, \alpha_0-2.22°, \alpha_0+4.44°, \alpha_0+1.11°, \alpha_0+17.78°, \alpha_0+24.44°)$ and $(\alpha_0-24.44°, \alpha_0-17.78°, \alpha_0-1.11°, \alpha_0-4.44°, \alpha_0+2.22°, \alpha_0+8.89°, \alpha_0+15.56°, \alpha_0+2.22°, \alpha_0+28.89°)$, wherein $\alpha_0$ is an arbitrary offset angle, the harmonic cancellation pattern at the transformer primary-side input is of 162-pulse, and the harmonic cancellation pattern within each secondary winding group is of 54-pulse.

12. The power conversion system of claim 1, wherein each power converter is selected from the group consisting of a cascaded H bridge power converter and a cascaded neutral point clamp power converter.

13. A power conversion system comprising:
a plurality of power converters;
a phase shifting transformer comprising 3-phase primary windings and a core;
a plurality of 3 secondary winding groups, wherein each of the secondary winding groups comprises a plurality of n secondary windings, n>1, in electromagnetic communication with the primary winding and feeding the plurality of power converters;
wherein each of the 3×n secondary windings are organized into one of two virtual secondary winding groups;
wherein each of the 1.5×n secondary winding in each virtual secondary winding group each has a secondary winding phase that is shifted from each adjacent secondary winding phase of each adjacent secondary winding within the secondary winding group by a secondary winding phase shift δ, where δ=60°/(1.5×n);
wherein the secondary winding phases of each virtual secondary winding group form a phase angle set of 1.5×n secondary winding phases $\alpha, \alpha+\delta, \ldots, \alpha+1.5\times(n-1)\delta$, where $\alpha$ is a secondary winding offset angle;
wherein $\alpha$ of a first virtual secondary winding group is further offset from the other virtual secondary winding groups by a group phase shift, where the group phase shift equals kδ/2, where k is any integer number; and wherein the phase shifted secondary windings within each virtual secondary winding group form a 9×n pulse harmonics cancellation pattern within each virtual secondary winding group and an overall harmonic cancellation pattern resulting from the all secondary winding in the transformer primary-side input is of 18×n pulse when k is an odd number and 9×n pulse when k is an even number.

14. The power conversion system of claim 13, wherein the number k equals an odd number, and the harmonics cancellation pattern for each of the 3 secondary winding groups is of 6×n pulse.

15. The power conversion system of claim 13, wherein the number k equals an even number, the harmonics cancellation pattern at a transformer primary-side input is 9×n pulse, and the harmonics cancellation pattern for each of the 3 secondary winding groups is of at least 3×n pulse.

16. The power conversion system of claim 15, wherein the number k=0 and the two virtual secondary winding groups have the same phase shift angle sets, wherein the harmonics cancellation pattern at the transformer primary-side input is 9×n pulse, the harmonics cancellation pattern for each of the 3 groups is of at least 3×n pulse.

17. The power conversion system of claim 16, wherein the number n of the secondary windings in each of the three secondary winding groups is 4 and the phase angle sets of the three secondary winding groups are ($\alpha_0-25°$, $\alpha_0-5°$, $\alpha_0+°5$, $\alpha_0+25°$), ($\alpha_0-15°$, $\alpha_0-5°$, $\alpha_0+15°$, $\alpha_0+25°$), and ($\alpha_0-25°$, $\alpha_0-15°$, $\alpha_0+5°$, $\alpha_0+15°$), wherein $\alpha_0$ is an arbitrary offset angle, the harmonic cancellation pattern at the transformer primary-side input is 36-pulse and the harmonic cancellation of each of the three secondary winding groups is at least 12-pulse.

18. The power conversion system of claim 16, wherein the number n of the secondary windings in each of the three secondary winding groups is 6 and the phase angle sets of the three secondary winding groups is ($\alpha_0-26.67°$, $\alpha_0-13.33°$, $\alpha_0-6.67°$, $\alpha_0+6.67°$, $\alpha_0+13.33°$, $\alpha_0+26.67$), ($\alpha_0-20°$, $\alpha_0-13.33°$, $\alpha_0+0°$, $\alpha_0+6.67°$, $\alpha_0+20°$, $\alpha_0+26.67$), and ($\alpha_0-26.67°$, $\alpha_0-20°$, $\alpha_0-6.67°$, $\alpha_0+0°$, $\alpha_0+13.33°$, $\alpha_0+20$), where $\alpha_0$ is an arbitrary offset angle, the harmonic cancellation pattern at the transformer primary-side input is 54-pulse, and the harmonic cancellation of each of the three secondary winding groups is at least 18-pulse.

19. The power conversion system of claim 16, wherein the number n of the secondary windings in each of the three secondary winding groups is 8 and the phase angle sets of the three secondary winding groups are ($\alpha_0+30°$, $\alpha_0+20°$, $\alpha_0+15°$, $\alpha_0+5°$, $\alpha_0+0°$, $\alpha_0-10°$, $\alpha_0-15°$, $\alpha_0-25°$), ($\alpha_0+30°$, $\alpha_0+25°$, $\alpha_0+15°$, $\alpha_0+10°$, $\alpha_0+0°$, $\alpha_0-5°$, $\alpha_0-15°$, $\alpha_0-20°$), and ($\alpha_0+25°$, $\alpha_0+20°$, $\alpha_0+10°$, $\alpha_0+5°$, $\alpha_0-5°$, $\alpha_0-10°$, $\alpha_0-20°$, $\alpha_0-25°$), wherein $\alpha_0$ is an arbitrary offset angle, the harmonic cancellation pattern at the transformer primary-side input is 72-pulse, and the harmonic cancellation of each of the three secondary winding groups is at least 24-pulse.

20. A power conversion system comprising:
a plurality of power converters;
a plurality of 3 phase shifting transformers each comprising a primary winding, a core, and a secondary winding group;
wherein each of the secondary winding groups comprises a plurality of n secondary windings, n>1, in electromagnetic communication with the corresponding primary winding and feeding the plurality of power converters;
wherein each of the secondary windings in each secondary winding group has a secondary winding phase that is shifted from each adjacent secondary winding phase of each secondary winding within the secondary winding group by a secondary winding phase shift δ where δ=60°/n;
wherein the secondary winding phases of each secondary winding group form a phase angle set of n secondary winding phases α, α+δ, . . . , α+(n−1)δ, where α is a secondary winding offset angle;
wherein α of a first secondary winding group is further offset from the other secondary winding groups by a group phase shift, where the group phase shift equals kδ/3 and k is any integer that is not a multiple of 3;
wherein the phase shifted secondary windings within each secondary winding group form a 6×n pulse harmonics cancellation pattern in a primary line current and an overall harmonic cancellation pattern resulting from the 3 secondary winding groups in a transformer primary-side input is of 18×n pulse.

* * * * *